(12) United States Patent
Jayaraman et al.

(10) Patent No.: US 11,932,541 B2
(45) Date of Patent: Mar. 19, 2024

(54) PROCESS AND APPARATUS FOR SYNTHESIZING MULTIWALL CARBON NANOTUBES FROM HIGH MOLECULAR POLYMERIC WASTES

(71) Applicant: NGEE ANN POLYTECHNIC, Singapore (SG)

(72) Inventors: Sundaramurthy Jayaraman, Singapore (SG); Ali Masud, Narayanganj (BD)

(73) Assignee: NGEE ANN POLYTECHNIC, Singapore (SG)

( * ) Notice: Subject to any disclaimer, the term of this patent is extended or adjusted under 35 U.S.C. 154(b) by 604 days.

(21) Appl. No.: 17/276,420

(22) PCT Filed: Aug. 16, 2018

(86) PCT No.: PCT/SG2018/050417
§ 371 (c)(1),
(2) Date: Mar. 15, 2021

(87) PCT Pub. No.: WO2020/036532
PCT Pub. Date: Feb. 20, 2020

(65) Prior Publication Data
US 2022/0055902 A1 Feb. 24, 2022

(51) Int. Cl.
*C01B 32/162* (2017.01)
*B01J 19/14* (2006.01)
(Continued)

(52) U.S. Cl.
CPC ............ *C01B 32/162* (2017.08); *B01J 19/14* (2013.01); *B01J 19/1862* (2013.01); *B01J 35/02* (2013.01);
(Continued)

(58) Field of Classification Search
CPC ............ C01B 32/162; C01B 2202/06; C01B 2202/34; C01B 2202/36; C01B 32/158; C01B 32/159; C01B 32/16; C01B 32/164; C01B 32/166; C01B 32/168; C01B 32/17; C01B 32/172; C01B 32/174; C01B 32/176; C01B 32/178; C01B 2202/00; C01B 2202/02; C01B 2202/04; C01B 2202/08;
(Continued)

(56) References Cited

U.S. PATENT DOCUMENTS

2005/0287297 A1 12/2005 Biris et al.
2011/0280794 A1* 11/2011 Holmes .................. C01B 32/15
977/843
2016/0367971 A1* 12/2016 Zhuo .................... B01J 23/8878

OTHER PUBLICATIONS

Zhou, On the Synthesis of Carbon Nanotubes from Waste Solid Hydrocarbons, PHD Thesis, Northeastern University, Boston, Massachusetts Aug. 2014 (pp. 1-353) (Year: 2014).*
(Continued)

*Primary Examiner* — Daniel C. McCracken
(74) *Attorney, Agent, or Firm* — Burns & Levinson LLP; Steven M. Mills

(57) ABSTRACT

This invention relates to a process and an apparatus for synthesizing multiwall carbon nanotubes from high molecular polymeric wastes. The process comprises using induction heating in combination with catalytic chemical vapour deposition (CVD) with an array of catalytic materials to synthesize high value carbon nanotubes with better yield and purity from high molecular polymeric wastes.

31 Claims, 17 Drawing Sheets

(51) Int. Cl.

| | |
|---|---|
| *B01J 19/18* | (2006.01) |
| *B01J 35/02* | (2006.01) |
| *B01J 37/08* | (2006.01) |
| *B01J 37/18* | (2006.01) |
| *B01J 38/02* | (2006.01) |
| *B09B 3/40* | (2022.01) |
| *C23C 16/26* | (2006.01) |
| *C23C 16/448* | (2006.01) |
| *C23C 16/46* | (2006.01) |
| *H05B 6/06* | (2006.01) |

(52) U.S. Cl.
CPC ............... *B01J 37/08* (2013.01); *B01J 37/18* (2013.01); *B01J 38/02* (2013.01); *B09B 3/40* (2022.01); *C23C 16/26* (2013.01); *C23C 16/448* (2013.01); *C23C 16/46* (2013.01); *H05B 6/06* (2013.01); *B01J 2219/00087* (2013.01); *B01J 2219/1943* (2013.01); *C01B 2202/06* (2013.01); *C01B 2202/34* (2013.01); *C01B 2202/36* (2013.01); *C01P 2002/82* (2013.01); *C01P 2002/88* (2013.01); *C01P 2004/03* (2013.01); *C01P 2004/04* (2013.01)

(58) Field of Classification Search
CPC ............ C01B 2202/10; C01B 2202/20; C01B 2202/22; C01B 2202/24; C01B 2202/26; C01B 2202/28; C01B 2202/30; C01B 2202/32; B01J 19/14; B01J 19/1862; B01J 35/02; B01J 37/08; B01J 37/18; B01J 38/02; B01J 2219/00087; B01J 2219/1943; B09B 3/40; B09B 5/00; C23C 16/26; C23C 16/448; C23C 16/46; C23C 16/4482; C23C 16/4488; C23C 16/45561; C23C 16/4583; H05B 6/06; H05B 6/02; H05B 6/36; C01P 2002/82; C01P 2002/88; C01P 2004/03; C01P 2004/04; B82Y 40/00; Y02W 30/62; D01F 9/12; D01F 9/127; D01F 9/1271; D01F 9/1272; D01F 9/1273; D01F 9/1274; D01F 9/1275; D01F 9/1276; D01F 9/1277; D01F 9/1278; D01F 9/133
See application file for complete search history.

(56) References Cited

OTHER PUBLICATIONS

Zhou, et al., Synthesis of carbon nanotubes by sequential pyrolysis and combustion of polyethylene, Carbon 2010; 48: 4024-4034 (Year: 2010).*

Sosnowchik, et al., Rapid synthesis of carbon nanotubes via inductive heating, Applied Physics Letters 2006; 89: 193112-1 to 193112-3 (Year: 2006).*

International Search Report dated Dec. 5, 2018, for related Application No. PCT/SG2018/050417.

Zhuo, C. et al., "Synthesis of carbon nanotubes by sequential pyrolysis and combustion of polyethylene", Carbon, 2010, vol. 48, pp. 4024-4034, Abstract; p. 4025, Section 2 & Fig. 1; p. 4026, 2nd & 3rd paragraphs; p. 4028, Fig. 4.

Alves, J. O., "Catalytic conversion of wastes from the bioethanol production into carbon nanomaterials", Applied Catalysis B: Environmental, 2011, vol. 106, pp. 433-444, Abstract; p. 434: Fig. 1; p. 436: 2nd paragraph & Section 2.3.

Zhuo, C., "On the synthesis of carbon nanotubes from waste solid hydrocarbons", Ph.D. Thesis, Northeastern University, Boston, Massachusetts, Aug. 2014, Abstract; p. 128, last paragraph to p. 130, 1st paragraph; Sections 7.1-7.2; Figs. 1, 5-6, 8-9 & 23.

Bell, T., "Properties and Composition of Type 201 Stainless Steel", Jul. 2018, [retrieved from the internet on Apr. 12, 2018] <URL: https://www.thebalance.com/type-201-stainless-steel-2340260>.

Anon., "Stainless Steel 304—Alloy Composition", ESPI Metals, Apr. 26, 2018, [retrieved from the internet on Apr. 12, 2018] <URL:https://web.archive.org/web/201 80426185435/http://www.espimetals.com/index.php/190-technical-data/stainless-steel-304-alloy-composition/200-stainless steel-304-alloycomposition>.

* cited by examiner

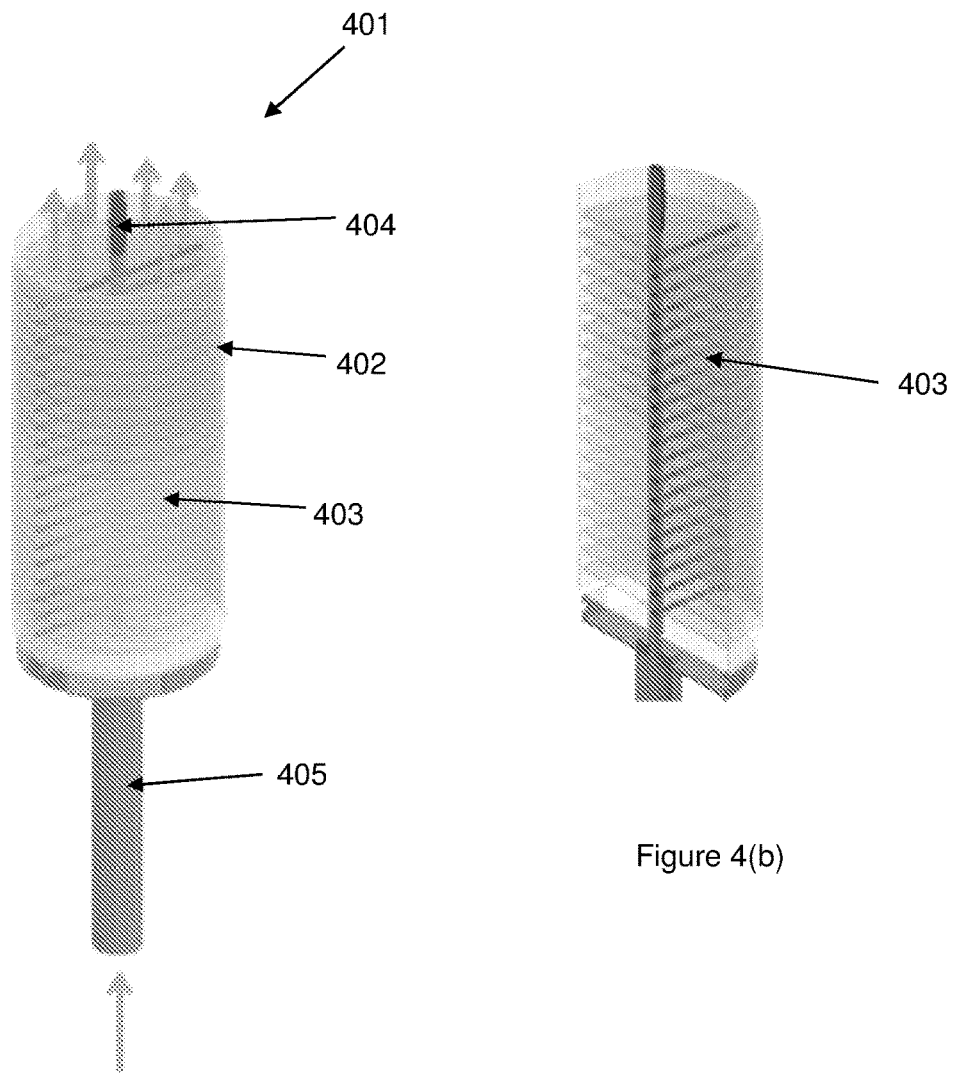
Figure 4(a)
Figure 4(b)
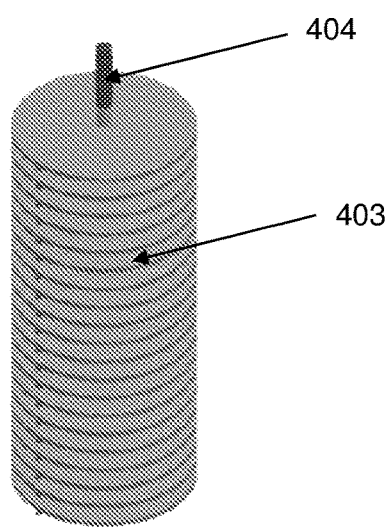
Figure 4(c)

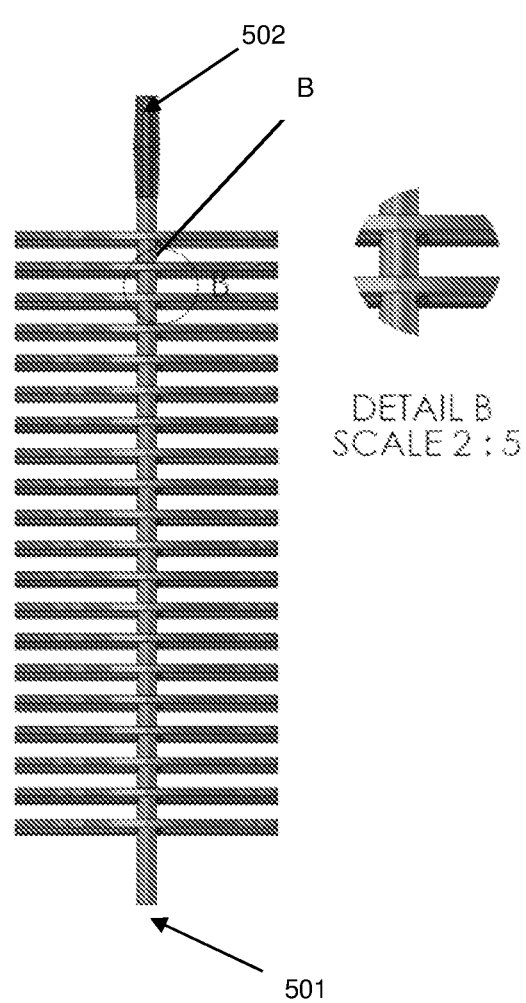
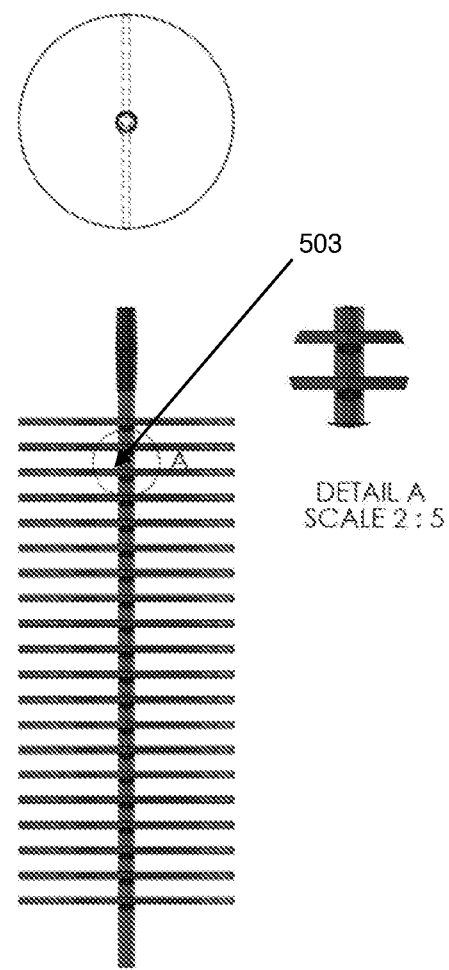
Figure 5(a)
Figure 5(b)

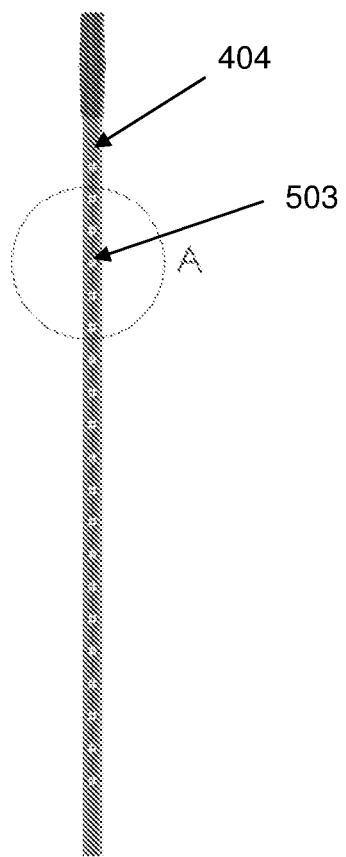
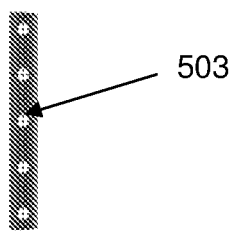
DETAIL A
SCALE 2:5
Figure 7(b)
Figure 7(a)

PROCESS AND APPARATUS FOR SYNTHESIZING MULTIWALL CARBON NANOTUBES FROM HIGH MOLECULAR POLYMERIC WASTES

CROSS-REFERENCE TO RELATED APPLICATIONS

This application is a U.S. national stage application under 35 U.S.C. 371 of co-pending International Application No. PCT/SG2018/050417, filed on Aug. 16, 2018, and entitled PROCESS AND APPARATUS FOR SYNTHESIZING MULTIWALL CARBON NANOTUBES FROM HIGH MOLECULAR POLYMERIC WASTES.

FIELD OF THE INVENTION

This invention relates to a process and an apparatus for synthesizing multiwall carbon nanotubes. In particular, the invention relates to a process and an apparatus for synthesizing multiwall carbon nanotubes from high molecular polymeric wastes.

BACKGROUND

Carbon Nanotubes are one of the allotropes of carbon exhibiting a crystalline or graphitic structure (Ajayan, P. M., Chem Rev 1999). They are bonded by a sp2 hybridized carbon molecular bonding alike graphene and rolled into a cylindrical structure (Cumings et al., Science 2000). They exist as either single wall carbon nanotubes (SWCNTs) or multi wall carbon nanotubes (MWCNTs). The unique electrical and mechanical properties garnered tremendous research and scientific interest since their discovery in the early nineties (Iijima, S., Nature 1991; Frackowiak, E., et al., Applied Physics Letters 2000). The MWCNTs differed from SWCNTs both structurally and functionally. The MWCNTs are composed of concentric single walled carbon nanotubes wrapped across one another having risen from the same catalyst branch, resulting in a higher diameter, stiffness and conductivity in MWCNTs compared with SWCNTs. These properties enabled MWCNTs to be employed in applications such as nanoporous membranes, cold cathode electric field emissions, supercapacitors, low friction nanobearings, ultra-sensitive electrometers and many more (Ajayan, P. M., Chem Rev 1999; Cumings et al., Science 2000; Frackowiak, E., et al., Applied Physics Letters 2000; Dai, H, Accounts of Chemical Research 2002; de Heer, W. A. et al., Science 1995; Roschier, L. et al., 2001; Shiflett, M. B. et al., Science 1999).

Carbon nanotubes (CNTs) are part of one of the fastest growing advanced nanomaterial technology market in the world. Currently, the carbon sources for synthesis of carbon nanotubes are derived from pure hydrocarbon gases and fossil fuels such as acetylene, methane, ethylene, benzene, xylene etc (Bazargan, A., et al., Chemical Engineering Journal 2012). Due to increasing usage and demand of carbon nanotubes in various applications, researchers are constantly looking for cheap and alternative carbon sources for the production of high quality carbon nanotubes to meet world-wide demands. One such alternative is utilization of non-degradable plastic materials which comprise long chain hydrocarbons and is an environmental concern globally (Liu, Y., et al., Fuel Processing Technology 2000; Kim, S.-S, et al., Chemical Engineering Journal 2004). Despite all of the technological advances over the recent years in the reclamation of plastics, there remains a substantial amount of the plastic waste stream that cannot be recycled due to contamination, lack of markets or the inability to separate plastics, which makes recovery impractical. Moreover, the longer the hydrocarbon chains, the higher the temperature that is required for the synthesis of carbon nanotubes to produce higher yields. Hence, a better and efficient approach is required to use the non-biodegradable carbon feedstock such as plastic wastes to produce carbon nanotubes.

Carbon nanotubes are widely synthesized using three different reactor configurations: arc discharge, laser vaporization and chemical vapour deposition, depending on the carbon source and limitations (Bazargan, A. et al., Chemical Engineering Journal 2012). The arc discharge method requires a very high temperature (of ~4000° C.) to evaporate graphite electrodes placed in an electric arc. The carbon nanotubes synthesized from the arc discharge method display good crystallization (Ando, Y. et al., Japanese Journal of Applied Physics Part 2 Letters 1993). However, the carbon nanotubes tend to have a lot of impurities in the form of amorphous carbon and metal particles, in the range of over 60-70% (Thess, A. et al., Science 1996; Li, H. et al., The Journal of Physical Chemistry B 2004). In the laser vaporization method, a high power laser is used to evaporate a highly pure graphite target at an elevated temperature. The carbon nanotubes produced from the laser vaporization method are of high purity but the production yield is very low (Dai, H. et al., The Journal of Physical Chemistry B 1999; Hou P.-X et al., Carbon 2008). Both of the arc discharge and the laser vaporization methods are not economical, require very high energy, resources input and complicated process conditions. To overcome these limitations, chemical vapour deposition (CVD) method is widely employed for synthesizing carbon nanotubes in which hydrocarbons are thermally decomposed to form carbon nanotubes in the presence of metal catalysts. To date, catalytic CVD process is the most economical and scalable approach employed for producing carbon nanotubes in bulk. However, there are also limitations in the CVD method in which the method requires high energy and has low heating rate during the initial heating process. Moreover, the uniform heating and efficiency of the process are dependent on the heating sources, thus making it difficult to control the heating and efficiency of the process.

It is therefore desirable to provide a process and an apparatus for synthesizing multiwall carbon nanotubes that seeks to address at least one of the problems described hereinabove, or at least to provide an alternative.

SUMMARY OF INVENTION

In accordance with one aspect of this invention, a process for synthesizing multiwall carbon nanotubes is provided. The process comprises depolymerizing high molecular polymeric wastes to obtain a carbon-containing feedstock; feeding the carbon-containing feedstock into a catalytic reactor containing an array of catalytic materials consisting of stainless steel, wherein the array of catalytic materials is arranged in a stacked manner having a space between any two adjacent catalytic materials sufficient to allow multiwall carbon nanotubes to grow and deposit on surfaces of the catalytic materials; heating the array of catalytic materials in the presence of the carbon-containing feedstock by induction heating to form multiwall carbon nanotubes on the surfaces of the catalytic materials; and removing the multiwall carbon nanotubes from the surfaces of the array of catalytic materials.

In one embodiment, the step of depolymerizing the long chain polymeric carbon sources comprises heating the long chain polymeric carbon sources at a temperature between 400° C. and 480° C. in an inert atmosphere.

In one embodiment, the process further comprises feeding the carbon-containing feedstock into a bubbler; and bubbling an inert gas through the carbon-containing feedstock in the bubbler prior to feeding the carbon-containing feedstock into the reactor.

In one embodiment, the process further comprises preheating the array of catalytic materials in the presence of a reducing gas to activate active sites on the surfaces of the array of catalytic materials prior to feeding the carbon-containing feedstock into the catalytic reactor. In another embodiment, the process further comprises heating the array of catalytic materials in the presence of a reducing gas at the same time as heating the array of catalytic materials in the presence of the carbon-containing feedstock.

In one embodiment, the process further comprises mixing the carbon-containing feedstock and the inert carrier gas with a reducing gas prior to feeding the carbon-containing feedstock into the catalytic reactor.

In one embodiment, the array of catalytic materials consists of catalytic materials in the form of plates, meshes or sheets consisting of layers of sheets of stainless steel.

In one embodiment, the long chain polymeric carbon sources are one or more selected from the group consisting of waste organic solvents, used vegetable oil and cooking oil, low molecular gaseous hydrocarbons including acetylene, xylene and compressed natural gas, and one or more long chain thermoplastic polymers selected from the group consisting of polypropylene, polyethylene, polystyrene, rubbers.

In one embodiment, the induction heating is carried out at a temperature between 600° C. and 1000° C.

In accordance with a second aspect of this invention, an apparatus for synthesizing multiwall carbon nanotubes is provided. The apparatus comprises a chamber for depolymerizing high molecular polymeric wastes; a catalytic reactor in fluid communication with the chamber, wherein the catalytic reactor comprises a cylindrical outer casing; an array of catalytic materials consisting of stainless steel; a holder assembly configured to hold and support the array of catalytic materials, the holder assembly having an inlet, an outlet and a plurality of apertures provided along the longitudinal surface of the holder assembly; wherein the array of catalytic materials is arranged in a stacked manner having a space between any two adjacent catalytic materials sufficient to enable multiwall carbon nanotubes to grow on surfaces of the catalytic materials; a gas distributor channel connected to the holder assembly; and a heating element wound around the external wall of the outer casing capable of providing uniform induction heating to the array of catalytic materials within the catalytic reactor.

In one embodiment, the apparatus further comprises a first bubbler in fluid communication with the chamber and the catalytic reactor, configured for processing depolymerised feedstock from the chamber and feeding the depolymerized feedstock to the catalytic reactor. In a further embodiment, the apparatus further comprises a second bubbler in fluid communication with the catalytic reactor.

In accordance with a third aspect of this invention, a catalytic reactor for synthesizing multiwall carbon nanotubes is provided. The catalytic reactor comprise a cylindrical outer casing; an array of catalytic materials consisting of stainless steel; a holder assembly configured to hold and support the array of catalytic materials within the cylindrical outer casing, wherein the holder assembly having an inlet, an outlet and a plurality of apertures provided along the longitudinal surface of the holder assembly for distributing gases from within the holder assembly into the catalytic reactor; a gas distributor channel having a gas inlet and a gas outlet, wherein the gas outlet is connected to the inlet of the holder assembly; and a heating element wound around the external wall of the outer casing capable of providing uniform induction heating to the array of catalytic materials within the catalytic reactor, wherein the array of catalytic materials is arranged in a stacked manner having a space between any two adjacent catalytic materials sufficient to allow multiwall carbon nanotubes to be formed on surfaces of the catalytic materials.

In one embodiment, the gas distributor channel further comprises a circular disc provided proximate the gas outlet of the gas distributor channel, wherein the circular disc having fastening means for fastening the gas distributor channel to the cylindrical outer casing of the catalytic reactor.

BRIEF DESCRIPTION OF THE DRAWINGS

The above advantages and features of a process and apparatus in accordance with this invention are described in the following detailed description and are shown in the drawings:

FIG. 4(a) shows a complete assembled view of the catalytic reactor and the arrangement of the array of catalytic materials within the catalytic reactor, configured to promote induction heating and interface contact area; FIG. 4(b) shows the cross-sectional view of the catalytic reactor of FIG. 4(a). FIG. 4(c) shows an assembled view of the array of catalytic materials in accordance with an embodiment of the present invention.

FIG. 5(a) shows a side view the array of catalytic materials, held and supported in place by the holder assembly. FIG. 5(b) shows the top, side and bottom views of the array of catalytic materials with the holder assembly in accordance with an embodiment of the present invention.

FIG. 7(a) shows the side view of the holder assembly with a plurality of apertures provided along the longitudinal surface of the holder assembly. FIG. 7(b) is an exploded view of section A as shown in FIG. 7(a).

DETAILED DESCRIPTION

Figure 1:
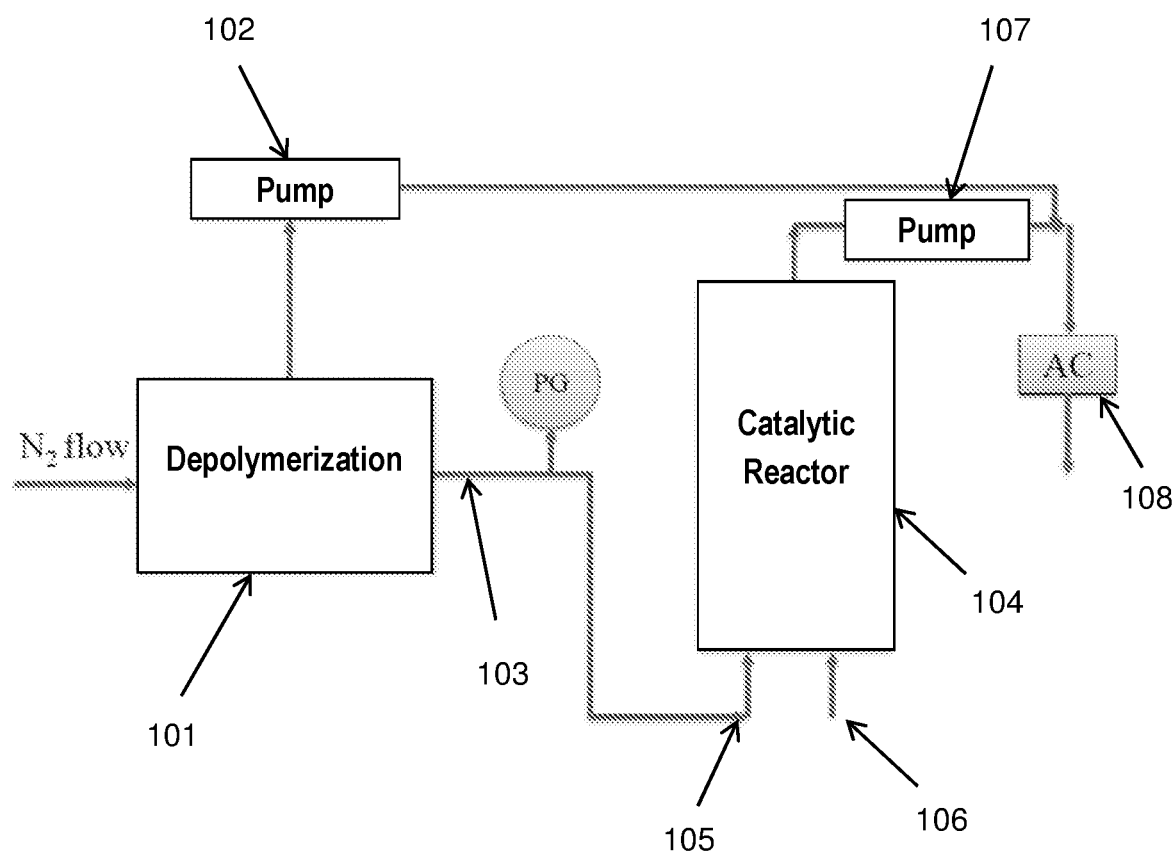
FIG. 1 illustrates an overall schematic of the catalytic CVD process in converting waste plastics and oils to carbon nanotubes in accordance with an embodiment of the present invention.

This invention relates to a process and an apparatus for synthesizing multiwall carbon nanotubes from high molecular polymeric wastes. The process comprises using induction heating in combination with modified catalytic chemical vapour deposition (CVD) process to synthesize high value carbon nanotubes (CNTs) with better yield and purity from low value high molecular polymeric wastes.

Induction heating relies on the unique characteristics of the radio frequency (RF) energy. The heating process occurs in an electrically conducting object (such as metal) by electromagnetic induction. The eddy currents generated in the conducting object allow precise and localized heat without any direct contact with the induction coil and the object. Induction heating process is very repeatable and controllable. It is capable of facilitating instantaneous heating and achieving uniform high temperature in the reactor within a relatively short period of time. It leads to low energy consumption and overall shorter reaction time. However, the efficiency of the induction heating process depends largely on the design of the inductor (i.e. coupling between the induction coil and the object to be heated), object size, material type, power and the frequency penetration depth. In the present invention, the electrically conducting object is selected in such a way that it generates high eddy current and also acts as a catalyst to dissolve hydrocarbons (or carbon-containing feedstock) on the surfaces of the catalytic materials to facilitate growth of carbon nanotubes on the surfaces of the catalytic materials. In this aspect, the selection of an appropriate conducting material as a catalyst plays a critical role for both the induction heating and catalytic processes.

In accordance with one aspect of the invention, a process for synthesizing multiwall carbon nanotubes from high molecular polymeric waste is provided. The process comprises depolymerizing high molecular polymeric waste to short chain hydrocarbons for use as a carbon-containing feedstock. The carbon-containing feedstock is fed into a catalytic reactor containing an array of catalytic materials consisting of stainless steel. The array of catalytic materials is heated in the catalytic reactor in the presence of the carbon-containing feedstock by induction heating for sufficient time to allow multiwall carbon nanotubes to grow on surfaces of the array of catalytic materials. The multiwall carbon nanotubes formed are then removed from the surfaces of the array of catalytic materials.

The term "high molecular polymeric wastes" as used herein refers to long chain hydrocarbons or long chain polymeric carbon sources. Examples of high molecular polymeric wastes include, but are not limited to, plastic wastes, waste rubber oils and waste cooking oils. Examples of plastic wastes include, but are not limited to, polystyrene, polypropylene, polyethylene, and other plastic materials.

The term "short chain hydrocarbons" as used herein refers to hydrocarbons with mainly $C_6$-$C_{10}$ molecules. The short chain hydrocarbons are used as carbon-containing feedstock for synthesizing multiwall carbon nanotube.

FIG. 1 shows a general schematic of the catalytic CVD process in accordance with one embodiment of the present invention.

In one embodiment, the step of depolymerization comprises depolymerizing the high molecular polymeric wastes in a vacuum oven (101). The vacuum oven is depressurized to remove atmospheric air. An inert gas, for example nitrogen gas is fed into the vacuum oven to create an inert gas atmosphere within the vacuum oven to avoid combustion of depolymerized hydrocarbon at decomposition temperature. In one embodiment, the vacuum oven operates at a temperature of 400° C. to 480° C., depending on the type of polymeric wastes to be depolymerized and used as the carbon sources for the synthesis of multiwall carbon nanotubes. The pressure in the vacuum oven is maintained at 100 Torr to 400 Torr (or $1.33 \times 10^4$ to $5.33 \times 10^4$ Pa), by a pump (102). In one embodiment, the high molecular polymeric wastes are heated in the vacuum oven (101) at a temperature between 400° C. and 480° C. for a period of 30 to 120 minutes. The high molecular polymeric wastes contain long chain hydrocarbons. During the depolymerization process, the long chain hydrocarbons break down, converting the solid polymeric wastes to liquid hydrocarbon, that is, to hydrocarbon oil consisting of short chain hydrocarbon.

The liquid hydrocarbon from the vacuum oven is transferred via a conduit (103) to the catalytic reactor (104) by an inert carrier gas. Any suitable type of inert carrier gas may be used. In one embodiment, the inert carrier gas is nitrogen. The transfer of the liquid hydrocarbon by the inert carrier gas from the vacuum oven to the catalytic reactor converts the liquid hydrocarbon to gaseous phase. This occurs due to a difference in the vapour pressure as the liquid hydrocarbon travels from the vacuum oven to the catalytic reactor. The inert carrier gas flow is maintained at around 60 to 150 SCCM. The gaseous phase of the hydrocarbon is used as a carbon-containing feedstock (105) for synthesizing multiwall carbon nanotubes in the catalytic reactor.

The carbon-containing feedstock (105) is fed into the catalytic reactor (104) which comprises an array of catalytic materials. The array of catalytic materials is made of stainless steel.

Generally, transition metals such as iron, cobalt and nickel are employed as catalysts in catalytic CVD process for the carbon nanotubes growth from hydrocarbons (Andrews, R., et al., *Chemical physics letters* 1999; Lupu, D, et al., *Carbon* 2004). Apart from the transition metals, other metals such as copper, silver, platinum, palladium and gold are also found to catalyze the carbon nanotubes growth from different hydrocarbons (Yuan, D., et al., *Nano letters* 2008). However, the costs of such catalysts and their availability impacted the production of carbon nanotubes at a commercial level. Moreover, the catalyst retrieval from carbon nanotubes involves vigorous wet methods including acid etching which often compromise the overall quality of the synthesized carbon nanotubes.

In the present invention, stainless steel is employed as the catalyst for several reasons. Stainless steel is relatively cheaper as compared to other transition metals. This helps to reduce the overall production cost and made the process more cost-effective. Stainless steel is easily available and it is also a good conductor of heat. This helps to facilitate both induction heating and act as a catalyst during the process. Stainless steel in the form of mesh is porous and rigid. The porous and rigid nature of the mesh allows the mesh to have a higher surface area with more catalytic active sites for growth of carbon nanotubes. The catalytic materials made of stainless steel allow carbon nanotubes to grow on the surfaces of the catalytic materials and this allows easy separation of the carbon nanotubes from the catalytic materials.

The stainless steel used in the present invention can be of any suitable grade including, but not limited to, stainless steel 304 and stainless steel 201. Preferably, the stainless steel is of type 304 with relatively low chromium content. Preferably, the chromium content is less than 12%.

The array of catalytic materials consisting of stainless steel can be in various forms including, but not limited to, metal rods, plates, meshes or sheets arranged in a several layers. The array of catalytic materials is arranged in a horizontally stacked manner such that there should be sufficient space between any two adjacent catalytic materials to allow multiwall carbon nanotubes to grow and deposit on the surfaces of the catalytic materials. Preferably, the catalytic materials are in the form of plates or meshes, arranged in a horizontally stacked manner to form the said array of catalytic materials. In the embodiment wherein the catalytic materials are in the form of metal rods, each of the catalytic materials comprises a plurality of metal rods arranged side-by-side to form a plate, and a plurality of said plates is provided to form the array of catalytic materials.

The array of catalytic materials in the catalytic reactor is heated in the presence of the carbon-containing feedstock to form multiwall carbon nanotubes on the surfaces of the array of catalytic materials. The array of catalytic materials is heated by induction heating. The array of catalytic materials consisting of stainless steel is capable of acting as a catalyst and also possesses magnetic property to enable induction heating by induction coils. Induction heating allows uniform heating of the array of catalytic materials in the catalytic reactor. This allows uniform formation of the multiwall carbon nanotubes on the surfaces of the catalytic materials when the carbon-containing feedstock comes into contact with the heated array of catalytic materials.

In one embodiment, the array of catalytic materials is reduced prior to feeding the carbon-containing feedstock into the catalytic reactor. The reduction is done by passing a reducing agent (106) such as hydrogen gas into the catalytic reactor containing the array of catalytic materials. The array of catalytic materials can be treated with the reducing agent for a time sufficient to activate the catalyst.

In another embodiment, the array of catalytic materials is reduced at the same time as heating the array of catalytic materials in the presence of the carbon-containing feedstock. The reduction is done by passing the reducing agent (106) into the catalytic reactor at the same time as introducing the carbon-containing feedstock (105) into the catalytic reactor. In one embodiment, the carbon-containing feedstock, along with the inert carrier gas, such as nitrogen is mixed with a reducing agent such as hydrogen prior to introducing the carbon-containing feedstock into the catalytic reactor. In this embodiment, the nitrogen to hydrogen gas flow ratio is maintained at 1:4 to 1:10.

In one embodiment, the catalytic process in the catalytic reactor is maintained at a temperature ranging from 600° C. to 900° C. at a vacuum pressure of 100 Torr-400 Torr (or $1.33 \times 10^4$ to $5.33 \times 10^4$ Pa) for 1 to 2 hours, depending on the chemical composition of the carbon sources. The carbon-containing feedstock heated in the presence of a reducing environment together with the array of catalytic materials in the catalytic reactor at high temperature leads to the growth of multiwall carbon nanotubes on the surfaces of the array of catalytic materials. The arrangement of the catalytic materials in an array and stacked manner enhances the interface between the carbon-containing feedstock and the catalytic materials. This enables efficient induction heating to attain high temperature of about 600° C. to 1,000° C. within a relatively short period of time, such as within 5 minutes.

The multiwall carbon nanotubes formed and deposited on the surfaces of the array of catalytic materials are removed and collected. Any suitable means for removing the multiwall nanotubes may be employed. In an exemplary embodiment, the multiwall carbon nanotubes are removed by simple mechanical agitation. In another exemplary embodiment, the carbon nanotubes are removed by ultrasonication of the catalytic materials in ethanol solvent. The ultrasonication is carried out for a sufficient time to allow the multiwall carbon nanotubes to loosen from the surfaces of the array of catalytic materials. The multiwall carbon nanotubes are then collected and subjected to thermal drying.

Figure 2:
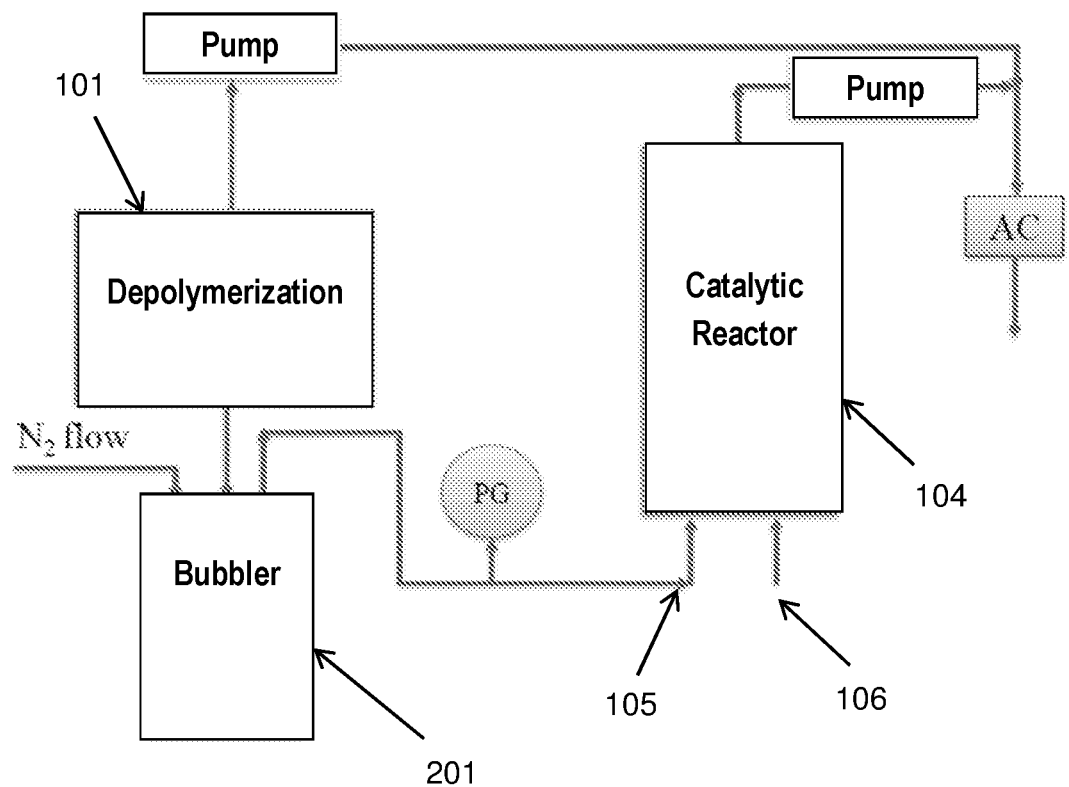
FIG. 2 illustrates an overall schematic of the catalytic CVD process in converting waste plastics and oils to carbon nanotubes in accordance with another embodiment of the present invention.

In another embodiment, as shown in FIG. 2, the process of the present invention further comprises passing the carbon-containing feedstock obtained from the depolymerization step through a bubbler (201) prior to feeding the carbon-containing feedstock into the catalytic reactor (104). In this embodiment, after the depolymerization of the long chain polymeric carbon sources, liquid hydrocarbon such as oil is obtained and the oil is collected in the bubbler (201) separately. An inert gas such as nitrogen is bubbled into the bubbler (201) and the mixture is heated to a temperature of 320° C. to 450° C. The temperature to be heated is dependent on the GC-MS data of the oil obtained from the depolymerization and the quantity of the long chain polymeric carbon source that is to be processed. The bubbling of the liquid hydrocarbon into the bubbler enables the diffusion controlled mass transfer of the liquid hydrocarbon to gaseous phase and also converts the liquid hydrocarbon to gaseous phase before the gaseous hydrocarbon is fed into the catalytic reactor as the carbon-containing feedstock for synthesizing the multiwall carbon nanotubes.

Figure 3:
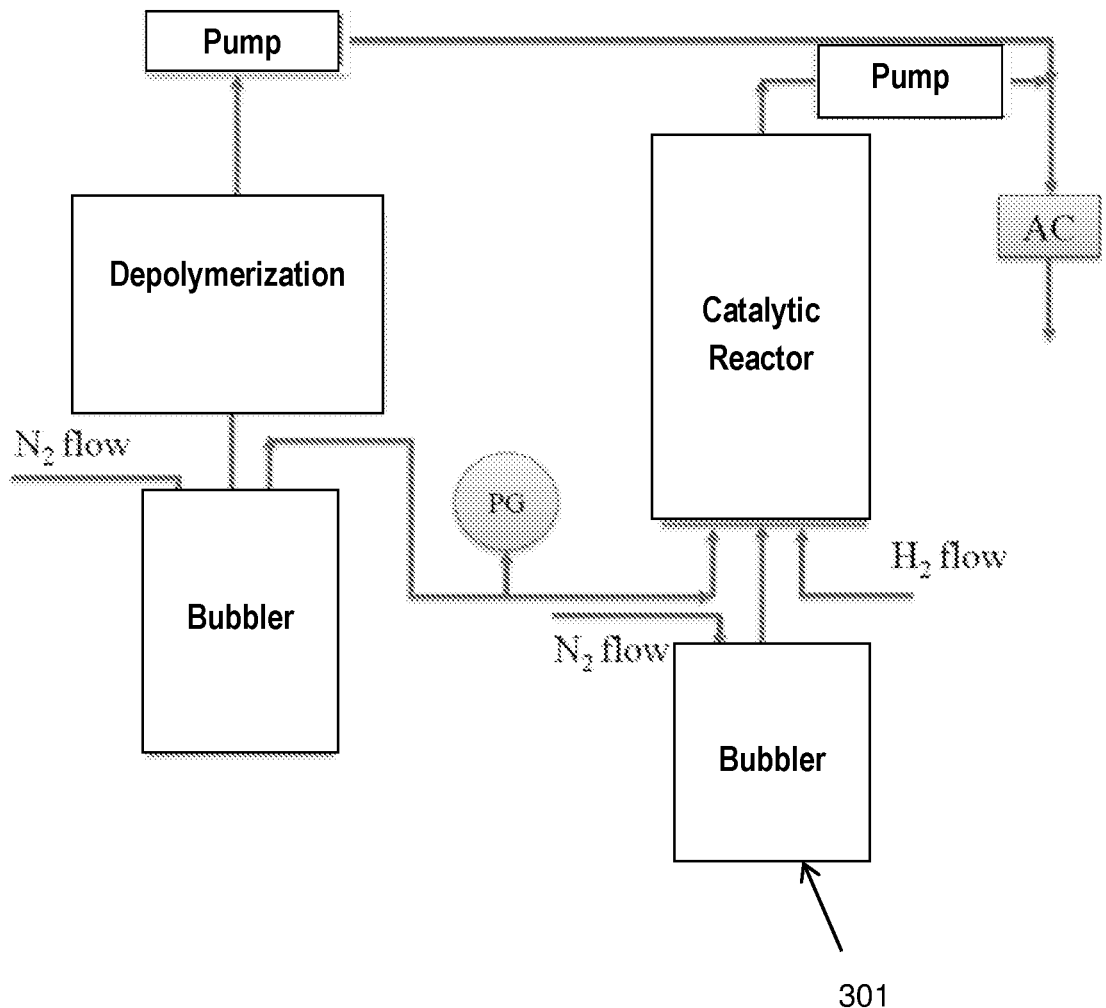
FIG. 3 illustrates an overall schematic of the catalytic CVD process in converting waste plastics and oils to carbon nanotubes in accordance with yet another embodiment of the present invention.

In yet another embodiment, as shown in FIG. 3, the process further comprises passing the carbon-containing feedstock obtained from the depolymerization step through a first bubbler (201) prior to feeding the carbon-containing feedstock into the catalytic reactor (104); and passing a second carbon source into a second bubbler (301) to obtain a second carbon-containing feedstock prior to feeding the second carbon-containing feedstock into the catalytic reactor (104). In this embodiment, the first bubbler (201) is provided for handling heavy hydrocarbon, for example plastic oil, and the second bubbler (301) is provided for handling light hydrocarbon, for example ethanol.

The process may further comprise pre-treating the array of catalytic materials before being employed in the catalytic CVD process. The process comprises activating the array of catalytic materials by mild acid etching and subjecting the array of catalytic materials to thermal oxidation to create surface roughness and catalytic active sites on the surfaces of the array of catalytic materials for the deposition of multiwall carbon nanotubes on the surfaces of the catalytic materials. One of the purposes of the pre-treatment is to remove any organic residues from the surfaces of the array of catalytic materials and to create rough etched surfaces. The rough etched surfaces along with the array of catalytic materials act as catalytic active sites for the carbon nanotubes growth.

After the carbon nanotubes are removed from the surfaces of the array of catalytic materials, the array of catalytic materials can be reused. The array of catalytic materials is prepared for reuse by oxidizing the carbon residues that may be present on the surfaces of the catalytic materials to carbon dioxide in the catalytic reactor at air atmosphere around 500° C. to 600° C. After which, the array of catalytic materials are chemically pre-treated in the same manner as described hereinabove, to reactivate the surfaces for reuse in the next process.

Any unutilized carbon molecules are removed by activated carbon (AC) filter before being released into the environment. Similar approach is adopted for liquid carbon sources such as rubber and cooking oils. When liquid carbon sources are used, the liquid carbon sources are placed in a liquid container instead of the vacuum oven. Inert gas, for example, nitrogen gas is bubbled through the oil at a depolymerizing heating temperature of 290° C. to 400° C.

The multiwall carbon nanotubes produced by the process of the present invention are elongated, with individual filaments having lengths between 2 and 30 μm. The diameters are between 30 and 150 nm.

In one aspect, the multiwall carbon nanotubes are synthesized using the catalytic reactor such as the exemplary catalytic reactor illustrated in FIG. 4. Referring to FIG. 4, the catalytic reactor (401) comprises a cylindrical outer casino (402) having a heating element wound around the external wall of the outer casing (not shown); an array of catalytic materials (403) consisting of stainless steel; a holder assembly (404) configured to hold and support the array of catalytic materials (403) and a gas distributor channel (405) connected to the holder assembly (404).

The cylindrical outer casing (402) is capable of channeling air flow, increasing the intensity of eddy currents during induction heating and withholding the uniform heating around the array of catalytic materials. The outer casing channels the bypassed carbon-containing feedstock from the array of catalytic materials back to the active surfaces of the catalytic materials. The outer casing also facilitates complete mixing of the vapours in the catalytic reactor during the process. In one embodiment, the cylindrical outer casing has a length of about 440 mm to 500 mm and a diameter of about 150 mm to 200 mm.

The holder assembly (404) is configured to secure and support the array of catalytic materials (403) horizontally, with major surfaces of the catalytic materials facing upwards such that the major surfaces are capable of supporting multiwall carbon nanotubes that are to be grown and deposited on the surfaces of the catalytic materials. Any suitable means may be used to secure the array of catalytic materials to the holder assembly without departing from the scope of the present invention. The array of catalytic materials may be secured to the holder assembly by welding or by fastening means which allow easy removal of the catalytic materials from the holder assembly. The holder assembly (404) facilitates the handling of the catalytic materials (403) before and after the reaction. The holder assembly (404) is elongated, having a length that is longer or the same as the cylindrical outer casing and a diameter of 5 mm to 10 mm, preferably about 5 mm. The holder assembly comprises an inlet (501), an outlet (502) and a plurality of apertures (503) provided along the longitudinal surface of the holder assembly, through which the carbon-containing feedstock and other inert gases flow into the catalytic reactor. The plurality of apertures (503) is provided to distribute the carbon-containing feedstock gas and/or the other insert gases evenly along the array of catalytic materials. The array of catalytic materials should be secured to the holder assembly in a manner such that the catalytic materials do not obstruct the flow of the carbon-containing feedstock through the apertures and into the catalytic reactor. The apertures should be of a size that allows sufficient carbon-containing feedstock and other inert gases to pass through and distribute within the catalytic reactor. In one embodiment, each aperture has a diameter of about 3 mm to 5 mm, preferably about 3 mm.

Figure 6A:
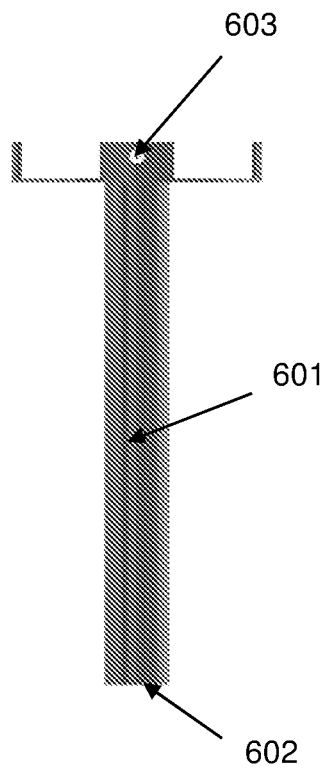
FIG. 6(a) shows the side view of the gas distributor channel in accordance with an embodiment of the present invention.
Figure 6B:
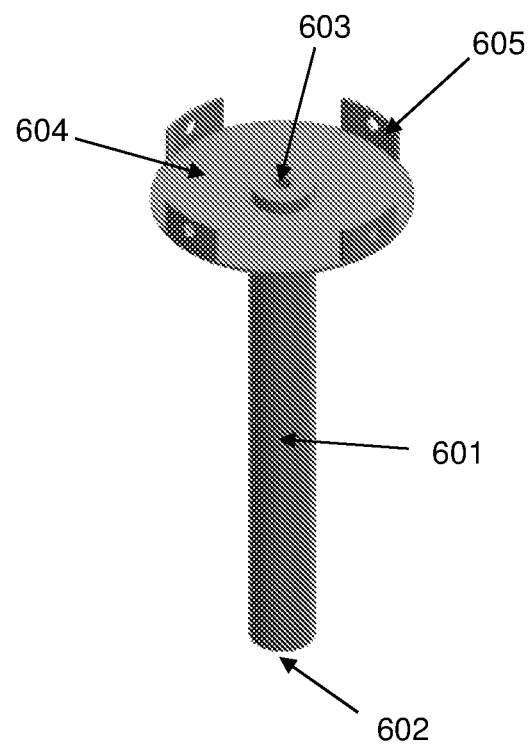
FIG. 6(b) shows a perspective view of the gas distributor channel.
Figure 6C:
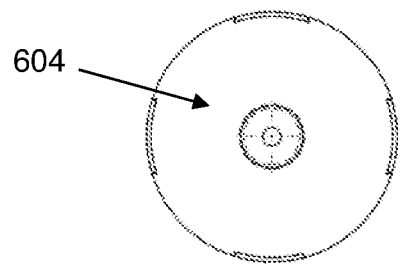
FIG. 6(c) shows the top view of the gas distributor channel to direct gas to the array of catalytic materials.
Figure 8A:
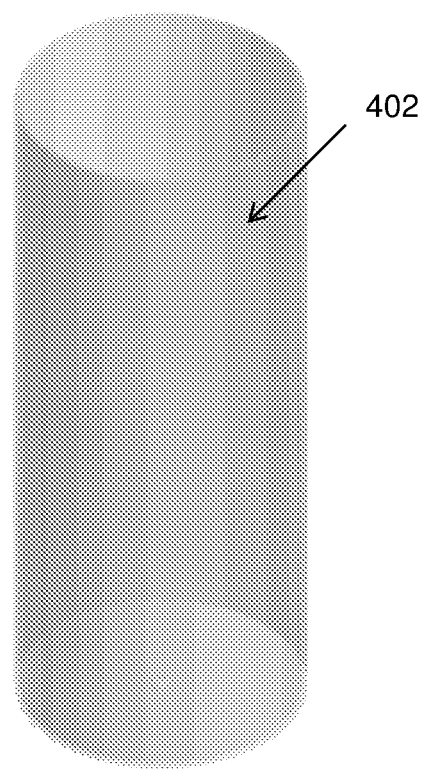
FIG. 8(a) shows the perspective view of the outer casing of the catalytic reactor.
Figure 8B:
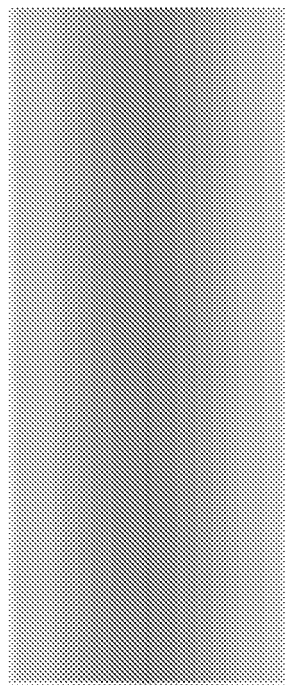
FIG. 8(b) shows the side view of the outer casing of the catalytic reactor.
Figure 8C:
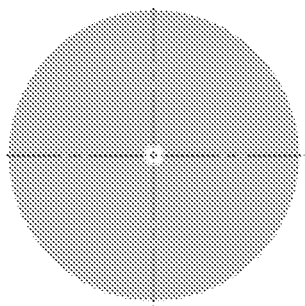
FIG. 8(c) shows the top view of the outer casing of catalytic reactor.

FIG. 4(b) shows a cross-sectional view of the catalytic reactor and the arrangement of the array of catalytic materials. FIG. 4(c) shows the array of the catalytic materials that is not mounted onto the gas distributor channel. FIG. 5 shows the side view of the array of catalytic materials and the manner in which the array of catalytic; materials is arranged and secured to the holder assembly, FIG. 6(a) shows the side view the gas distributor channel and FIG. 6(b) is a perspective view of the gas distributor channel. In one embodiment, the gas distributor channel (405) comprises an elongated channel (601) having a gas inlet (602), a gas outlet (603) and a circular disc (604) provided proximate the gas outlet (603). The gas distributor channel forms part of the catalytic reactor. The gas distributor channel can be an integral part of the catalytic reactor or it can be of a separate part that is removably secured to the outer casing of the catalytic reactor. In one embodiment, the gas distributor channel comprises protrusions (605) that extend perpendicularly from the edges of the circular disc. The protrusions engage and secure the gas distributor channel to the cylindrical outer casing (402) of the catalytic reactor (401). The protrusions can be of any suitable size and shape sufficient to secure the gas distributor channel to the cylindrical outer casing of the catalytic reactor.

The gas inlet (602) of the gas distributor channel is provided for receiving the carbon-containing feedstock and other inert gases. The gas outlet (603) is connected to the inlet (501) of the holder assembly to allow continuous flow of the carbon-containing feedstock and other inert gases from the channel (601) to the holder assembly (404). As the carbon-containing feedstock passes through the gas inlet (602) of the gas distributor channel (405), the carbon-containing feedstock travels towards the gas outlet (603) at opposite end of the gas inlet (602), and into the inlet (501) of the holder assembly. The carbon-containing feedstock passes through the holder assembly and evenly passes through the plurality of apertures of the holder assembly to be in contact with the array of catalytic materials in the catalytic reactor. The channel (405) of the gas distributor channel has an outer diameter of 40 mm to 48 mm, preferably 43 mm to 45 mm, and an inner diameter of 38 mm to 46 mm, preferably 41 mm to 43 mm. The channel (405) is narrowed down by a small opening having a diameter of about 11 mm to 13 mm, preferably about 12.5 mm to facilitate better mixing of the carbon-containing feedstock and the reactive gases before entering the apertures. In one embodiment, the channel (405) is for distributing reducing agent, such as hydrogen and for distributing carbon-containing feedstock into the catalytic reactor.

In one embodiment, the heating element is induction coils. Preferably, the induction coils are radio frequency induction copper coil that wound around the catalytic reactor to facilitate induction heating within the catalytic reactor. One skilled in the art will appreciate that the induction coils may be wound around the catalytic reactor in any suitable manner without departing from the scope of the present invention. The induction coils should generate sufficient eddy currents to inductively heat the array of catalytic materials and the carbon-containing feedstock to desired temperatures and maintaining the temperatures for a predetermined period if necessary.

The induction heating is carried out using radio frequency (RF) generator connected to an AC power supply capable of generating mid-frequencies in the range from 1 kHz to 60 kHz. The effectiveness of the induction heating within the catalytic reactor largely depends on the catalytic materials arrangement and the intensity of the eddy currents generated by the conducting catalytic materials inside the reactor. Moreover, the arrangement of the catalytic materials should have more interfacial contact area to allow the diffusion of carbon-containing feedstock on the surfaces of the catalytic materials and grow carbon nanotubes without any relative obstruction to the gas flow or vacuum. The configuration of the holder assembly and the arrangement of the array of catalytic materials facilitate the intense induction heating and maximise the contact area of the catalytic materials with the carbon-containing feedstock. The configuration of the catalytic reactor of the present invention is capable of generating a reaction temperature of 600° C. to 1,000° C. in the catalytic reactor within a relatively short period of time. In one embodiment, the catalytic reactor is capable of generating the said reaction temperature within 5 minute.

The catalytic reactor acts as a support for the array of catalytic materials and has magnetic property to allow induction heating to be carried out uniformly throughout the catalytic reactor. This provides uniform heating to the array of catalytic materials which is essential in achieving consistent growth of the multiwall carbon nanotubes on the surfaces of the catalytic materials. The catalytic reactor is configured to allow the array of catalytic materials to be arranged in a stacked manner to enable easy flow of the carbon-containing feedstock through the catalytic reactor and have better interaction with the catalytic materials. In one embodiment, the catalytic reactor has a nitrogen gas flow of 50 LPM to 180 LPM (or $0.833 \times 10^{-3}$ to $3 \times 10^{-3}$ m$^3$/s). The vacuum pressure is maintained at 100 Torr to 400 Torr (or $1.33 \times 10^4$ to $5.33 \times 10^4$ Pa) during induction heating around 600° C. to 1000° C. The catalytic reactor is connected to a vacuum pump (107) to enable control of pressure within the catalytic reactor.

In accordance with another aspect of the invention, an apparatus for synthesizing multiwall carbon nanotubes is provided. The apparatus comprises a chamber for depolymerizing high molecular polymeric wastes; and a catalytic reactor in fluid communication with the chamber, wherein the catalytic reactor comprises a cylindrical outer casing; an array of catalytic materials consisting of stainless steel; a holder assembly configured to hold and support the array of catalytic materials. The holder assembly consists of an inlet, an outlet and a plurality of apertures provided along the longitudinal surface of the holder assembly. The array of catalytic materials is arranged in a horizontally stacked manner having a space between any two adjacent catalytic materials sufficient to enable multiwall carbon nanotubes to grow on surfaces of the catalytic materials. The catalytic reactor further comprises a gas distributor channel connected to the holder assembly and a heating element wound around the external wall of the outer casing capable of providing uniform induction heating to the array of catalytic materials within the catalytic reactor.

The array of catalytic materials consists of stainless steel in a form of metal rod, plate, mesh or sheet consisting of layers of sheet of stainless steel. Preferably, the catalytic materials are in the form of plates or meshes, arranged in a horizontally stacked manner to form the said array of catalytic materials. In the embodiment wherein the catalytic materials are in the form of metal rods, each of the catalytic materials comprises a plurality of metal rods arranged side-by-side to form a plate, and a plurality of said plates is provided to form the array of catalytic materials.

The apparatus of the present invention may further include a first bubbler in fluid communication with the chamber and the catalytic reactor, configured for processing the depolymerised feedstock from the chamber and feeding the depolymerized feedstock to the catalytic reactor. The apparatus may further include a second bubbler in fluid communication with the catalytic reactor, as shown in FIG. 3. The apparatus may further include a mixer (not shown), positioned in the fluid passage between the chamber and the catalytic reactor. The mixer is provided to mix the carbon-containing feedstock and the inert carrier gas with the reducing gas prior to feeding the carbon-containing feedstock into the catalytic reactor.

Although inert gas, for example nitrogen is mentioned hereinabove, one skilled in the art will appreciate that other suitable inert gases may also be used without departing from the scope of the present invention.

The following examples illustrate various embodiments of this invention. One skilled in the art will recognize that the examples set out below are not an exhaustive list of the embodiments of this invention.

EXAMPLES

Materials and Methods

Plastic wastes such as polystyrene and polypropylene, rubber oils and waste cooking oils were obtained from local waste collectors. The metallic meshes were obtained from Wiremesh Industries, Singapore. Ethanol, isopropanol and acetone of analytical grade were obtained from Sigma-Aldrich, Singapore and used as received. Sulphuric acid was obtained from Merck, Singapore, and hydrochloric acid (37%) from Panreac, Singapore and used as received.

Characterization

The decomposition temperature of the plastic wastes and cooking oils were analyzed using thermogravimetric analysis (TGA) from Mettler-Toledo TGA DSC 1 system in nitrogen Atmosphere. The analysis was carried out from room temperature to 500° C. at a heating rate of 5° C./min. Gas chromatography coupled with mass spectrometry (GC-MS) (PerkinElmer, Clarus 6000) was employed to identify and quantify the chemical compositions of the plastic, rubber and cooking oils. The Raman spectra of multiwall MWCNTs were measured by Bruker SENTERRA Raman microscope ($\lambda$=534 nm, 5 mW) at room temperature. Field emission scanning electron microscopy (FESEM) (JEOL, JSM 7600F) coupled with energy-dispersive X-ray spectroscopy (EDX) (Oxford Instruments) were used to study the morphology of the carbon nanotubes and also the chemical compositions of the carbon nanotubes and catalyst surface. Transmission electron microscopy (TEM) (JEOL 2100F) was employed for the morphology confirmation of MWCNTs.

Results and Discussions

Prior to the catalytic CVD process, the process parameters and chemical compositions of the carbon sources were studied. To identify the depolymerization temperature of plastics and generation of small chain hydrocarbon vapours in the vacuum oven, the decomposition temperature of the plastics were first identified from TGA curves. The temperature at which the maximum generation of hydrocarbon vapours were selected down from the TGA spectra depends on the nature of plastics and the chemical compositions. In this example, thermoplastics such as polypropylene, polystyrene, and mixed polypropylene and polystyrene at 1:1, 1:2 and 2:1 wt %/wt % were studied as carbon-containing feedstocks for synthesising multiwall carbon nanotubes.

Figure 9A:
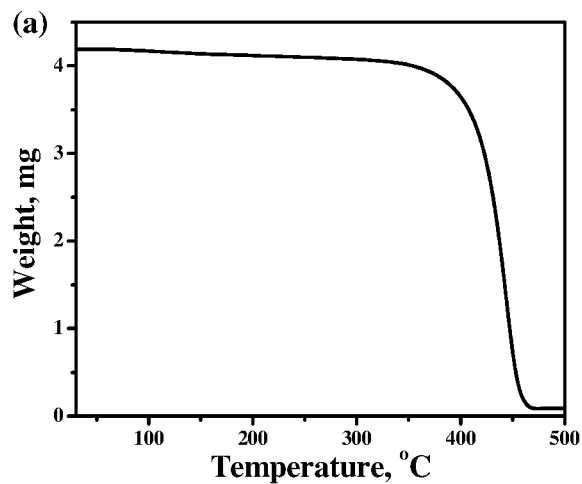
FIGS. 9(a) and (b) show the TGA curves of various carbon sources: (a) polypropylene; and (b) polystyrene at 5° C./min.
Figure 9B:
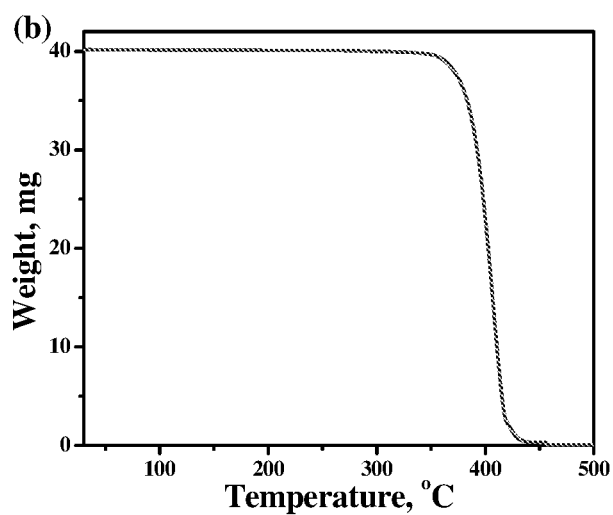
Figure 10A:
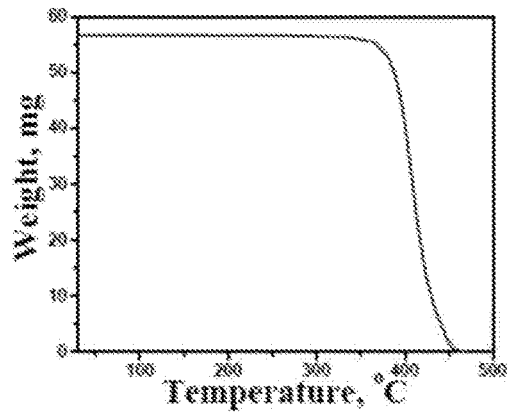
FIGS. 10(a), (b) and (c) show the TGA curves of various carbon sources: mixed polypropylene (PP) and polystyrene (PS) at (a) 1:1 wt %/wt %; (b) 1:2 wt %/wt %; and (c) 2:1 wt %/wt %, at 5° C./min.
Figure 10B:
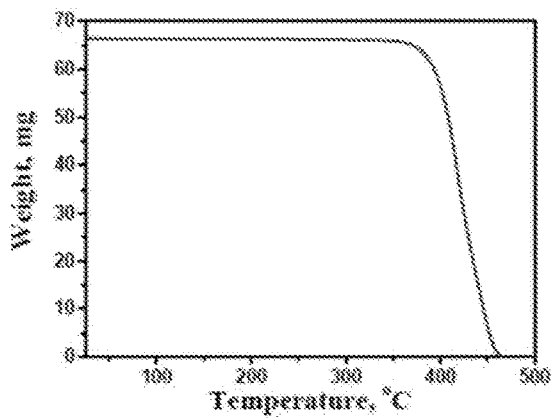
Figure 10C:
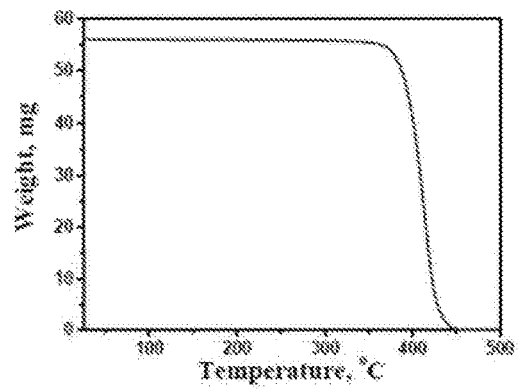

FIG. 9(a) and FIG. 9(b) show the TGA curves of polypropylene and polystyrene respectively. FIGS. 10(a)-(c) show the TGA curves of mixed polypropylene (PP) and polystyrene (PS) at a ratio of 1:1, 1:2 and 2:1 respectively. From the curves, it was observed that depolymerization occurred between the temperature of 380° C. and 460° C. So, the vacuum oven was operated in the temperature range of 400° C. to 480° C. to obtain the maximum yield of depolymerized small chain hydrocarbon molecules.

Figure 11A:
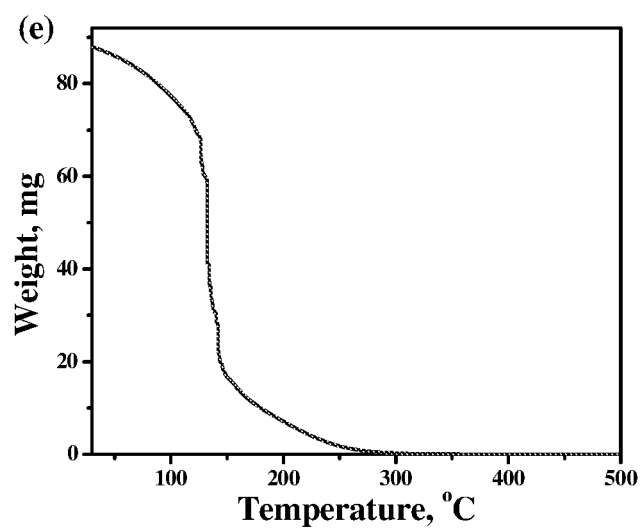
FIGS. 11(a) and (b) shows the TGA curves of various carbon sources: (a) rubber oil; and (b) cooking oil, at 5° C./min.
Figure 11B:
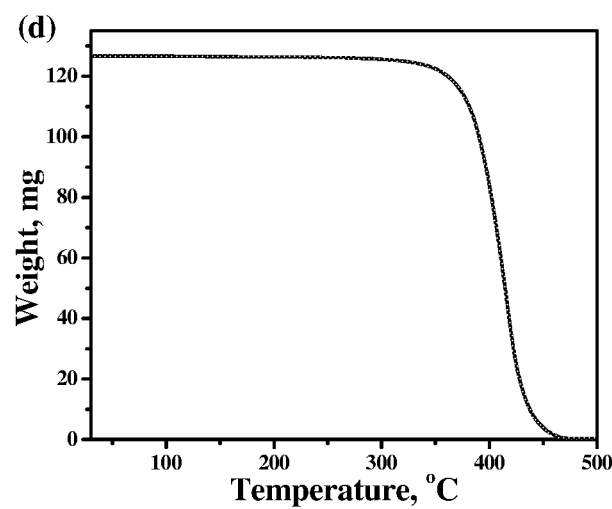

Similar TGA studies were also performed on rubber and vegetable oils to identify the operating temperatures. FIGS. 11(a) and (b) show the TGA curves of the waste cooking oil and rubber oil. From the curves, the operating temperature for vegetable oil was kept at around 400° C. to 480° C. and for the rubber oil, the temperature was kept around 180° C. to 250° C.

The pyrolysis of polystyrene and polypropylene were widely studied in literature both experimentally and theoretically. Reaction conditions like temperature, pressure and catalyst influences the conversion of the long chain polymeric carbon sources to small chain molecular hydrocarbon. The depolymerized hydrocarbons after pyrolysis vary chemically and structurally. The depolymerized hydrocarbons were widely classified as low to medium chain hydrocarbons ($C_2$-$C_{14}$ and above). These hydrocarbons have different boiling points, depending upon the chains' length and composition (Liu, Y., et al., *Fuel Processing Technology* 2000; Kim, S. —S, et al., *Chemical Engineering Journal* 2004). Liu, Y., et al., *Fuel Processing Technology* 2000 studied the pyrolysis of polystyrene and reported a complex set of hydrocarbons ranging from monomers to dimers and trimers. At 450° C., the polystyrene yielded more than 70% of low chain hydrocarbons and about 13% of heavy chain hydrocarbons. The major depolymerized hydrocarbons were of low molecular chain molecules such as benzene, toluene, styrene, and xylene with low boiling points. The library search of the spectra using GCMS software confirmed the presence of the same and similar molecular chain hydrocarbons. The depolymerized mixtures also consisted of medium boiling point hydrocarbon including branched diphenyl ethane, propene, butene, and pentene, and high boiling point hydrocarbon including branched tri-phenyl hexane. The pyrolysis of polypropylene led to the generation of free radicals and a complex mixture of hydrocarbons that includes alkanes, alkenes, alkynes, aromatics etc. (Kruse, T. M, et al., *Journal of analytical and applied pyrolysis* 2005; Sojak, L., et al., *Journal of Analytical and Applied Pyrolysis* 2007). The hydrocarbons range from $C_6$-$C_{25}$ and above. Kruse, T. M, et al., *Journal of analytical and applied pyrolysis* 2005 reported that the polypropylene pyrolysis at 420° C. yielded about 36% hydrocarbon chains lesser than $C_{15}$ molecules. Similar observation was confirmed with the GCMS analysis of the depolymerized polystyrene, polypropylene and mixed polystyrene and polypropylene oil at different weight ratios. The GCMS analysis of vegetable cooking oil confirmed the presence of majority $C_{16}$-$C_{20}$ molecules such as 1, 2-benzene dicarboxylic acid, hexadecanoic acid, octadecatrionic acid, phathalic acid, dibutyl phthalate and lower amounts of $C_6$-$C_9$ carbon chains, such as methyl styrene, styrene, etc. GCMS analysis of rubber oil confirmed the presence of a wide range of hydrocarbons upon pyrolysis (Benallal, B. et al., *Fuel* 1995). Rubber comprises polyisoprene and upon pyrolysis leads to low to medium chain hydrocarbons such as benzene, cyclo-benzene, hexane, toluene, 1-heptyne, octane, octyne, ethyl benzene, p-xylene, 1-naphthalene menthol.

From the TGA and GCMS studies of plastic wastes, upon maintaining the depolymerization temperature around 400° C.-480° C. in the vacuum oven, the majority of low chain hydrocarbons were converted to medium chain hydrocarbons. Moreover, the earlier studies reported that the type of hydrocarbon feedstocks influences the type of carbon nanotubes formation. Li, Q., et al., *Carbon* 2004 reported that the aromatic molecules like benzene, naphthalene and anthracene resulted in the formation of SWCNTs, whereas aliphatic and cyclic hydrocarbon chains resulted in a more complicated form like MWCNTs or non-tubular carbon structures. But, the overall reaction for carbon nanotube formation of hydrocarbon is still not proven. However, the most common model accepted in the presence of a transition metal catalyst was provided by Baker, R. T. K. et al., *Carbon* 1989; Baker, R. T. K. et al., *Journal of Catalysis* 1973.

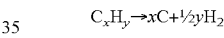

$$C_xH_y \rightarrow xC + \tfrac{1}{2}yH_2$$

Depending upon the carbon sources and chemical compositions, the process conditions of the entire catalytic CVD vary accordingly. Generally, the vacuum oven was kept at 400° C.-480° C. for plastics waste and for rubber oil around 180° C.-250° C. A vacuum pressure of about 100 Torr to 400 Torr (or $1.33 \times 10^4$ to $5.33 \times 10^4$ Pa) was maintained throughout the process. The nitrogen gas flow of about 100-120 SCCM was maintained when feeding the carbon sources to the catalytic CVD process. During the process, extra precautionary measures were implemented by using safety control valves to maintain an operating pressure well below 400 Torr (or below $5.33 \times 10^4$ Pa). The RF frequency in the range of 1 kHz to 35 kHz was employed and this resulted in induction heating of about 600° C. to 900° C. Moreover, the induction heating depends on the configuration of the holder assembly and the array of catalytic materials, as well as the intensity of eddy currents created upon the induction. Prior to the CVD process, the array of catalytic materials was reduced in the presence of hydrogen and nitrogen. The hydrogen to nitrogen gas ratio of about 1:6 to 1:10 was maintained in the CVD process when feeding the hydrocarbons. A reaction temperature of about 600° C. to 900° C. was maintained throughout the catalytic CVD process for about an hour. From the experimental studies, an overall yield of about 4% is achieved. Unlike the resistive heating process, the induction heating required only a 5 min duration, thus avoiding high energy consumption. The carbon nanotubes synthesized are separated from the catalyst using mechanical agitation and simple ultrasonication in ethanol solution followed by thermal drying. FESEM, TEM and Raman analysis were carried out on the carbon nanotubes to study the morphology and purity. FESEM and TEM confirmed the morphology of carbon nanotubes as multi-walled. Raman analysis confirmed the purity of synthesized MWCNTs.

Raman spectroscopy on carbonaceous materials reveals the information on the structure and properties of the material. The laser excitation of the material produces different bands that can enable the identification of the graphitic or amorphous structure of the carbon. The MWCNTs produced from the different hydrocarbon sources in this work showed two very distinct peaks at 1350 cm$^{-1}$ and 1575 cm$^{-1}$. The peaks corresponded to the D-band and G-band of the carbon. The G-band reveals information on the graphitic structure of the carbon and the D-band reflects the information on any structural imperfections in the graphitic structure of the graphene sheets like defects or impurities in the material (Dresselhaus, M. S, et al., *Physics Reports* 2005; Rao, A. M., et al., *Physical Review Letters* 2000). The quality of the MWCNTs produced in general was evaluated by the ratio of the intensities of the D-band and the G-band (ID/IG). A lower ID/IG ratio indicates higher quality of MWCNT since it reveals that the higher degree of structural ordering and purity (Yang, Z., et al., *Applied Physics* A 2010). The ID/IG ratios for the MWCNTs obtained from polypropylene, polystyrene and mixed polypropylene and polystyrene were 0.89, 0.73 and 0.8 respectively. The ID/IG ratio for the MWCNTS from rubber oil was 0.61, which displayed a very high quality of carbon nanotubes whereas the ratio for vegetable oil was 0.74. All MWCNTS synthesized exhibited an ID/IG ratio significantly lesser than 1 which was considered as very good quality of MWCNTs. The origin of a strong third peak at 2633 cm-1 was observed in all the hydrocarbon sources which arose from the double resonance of the two phonon from the Raman excitations (Alves, J. O., et al., *Applied Catalysis B: Environmental* 2011; Thomsen, C. et al., *Physical Review Letters* 2000). The peak is often referred as the 2D band and indicates the parallel graphitic layers of carbon nanotubes. The presence of this peak further confirmed and strongly indicated that the carbon nanotubes were of multi-walled, validating the observations from the TEM analysis.

Because of the unique arrangement of the array of catalytic materials in the catalytic reactor, the array of catalytic materials facilitated easy separation of the carbon nanotubes by mechanical separation and simple sonication which allowed the process to have an added advantage of reusing the catalytic materials which were used in the earlier process. After separating the carbon nanotubes from the catalytic materials, the catalytic materials were oxidized in an atmospheric air environment in the catalytic reactor at 500° C. to 600° C. for an hour. The residual carbons along with the catalytic materials were oxidized in the presence of oxygen to carbon dioxide, and the iron reduced earlier in an inert atmosphere at high temperatures was regenerated to its natural state. The catalytic materials were pre-treated as discussed earlier in the pre-treatment process to create rough and active sites. The regenerated catalytic materials allowed the growth of carbon nanotubes again and facilitated similar inducting heating.

Example 1—Catalyst Preparation

The stainless steel meshes/plates/rods were chemically pre-treated before being employed as catalytic materials in catalytic CVD. The chromium content in the stainless steel should be less than 12% for better carbon nanotubes growth. The stainless steel meshes/plates/rods were first rinsed in an acetone, ethanol or isopropanol mixture to remove particulate and organic residual contaminants. Then, the stainless steel meshes/plates/rods were mildly pre-treated in 3 to 10% in sulphuric acid or hydrochloric acid. The acid treated stainless steel meshes/plates/rods were reduced in the catalytic reactor at inert nitrogen atmosphere prior to use as catalytic materials for the catalytic CVD process.

Example 2—Polypropylene

Polypropylene was depolymerized at 400° C.-480° C. in the vacuum oven. A nitrogen gas flow of about 100 to 120 SCCM was bubbled through the depolymerized oil. The small chain hydrocarbon molecules were transferred and fed into the catalytic reactor and heated in the presence of the stainless steel mesh catalytic materials at a temperature between 700° C. and 800° C., with hydrogen to nitrogen gas flow ratio of about 1:6. A vacuum pressure lesser than 400 Torr (or lesser than 5.33×10$^4$ Pa) was maintained in the reactor.

Figure 12:
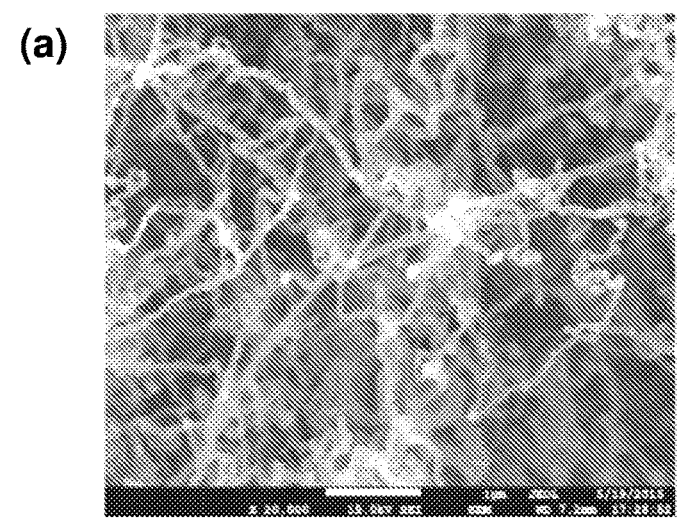
FIG. 12 shows (a) FESEM and (b) TEM images, and (c) Raman analysis of the MWCNTs synthesized from polypropylene.
Figure 12:
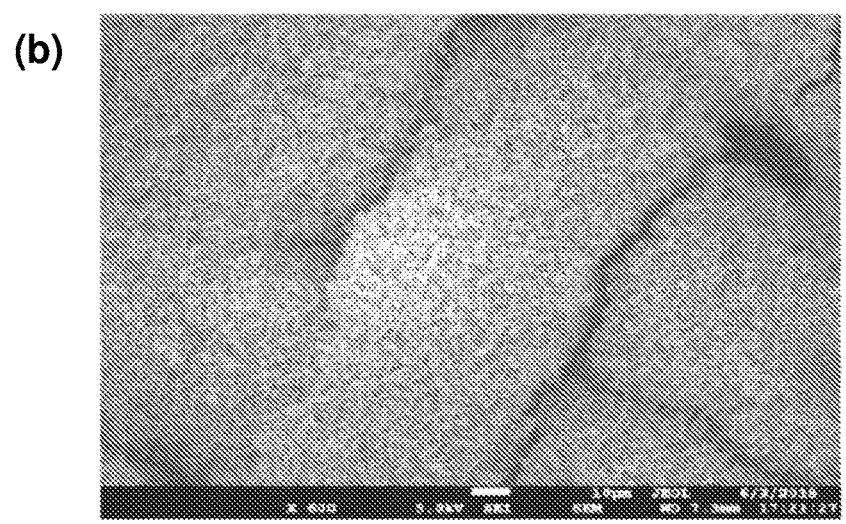
Figure 12:
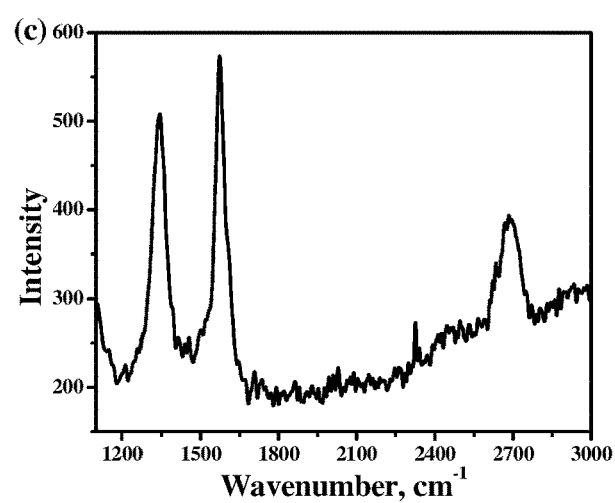

FIG. 12 shows the morphology and purity analysis of the synthesized carbon nanotubes using (a) FESEM; (b) TEM; and (c) Raman analysis. The MWCNTs obtained in this example had diameters in the range of 30 nm to 150 nm, and lengths of 2 μm to 5 μm. The EDS analysis further confirmed the MWCNTs of high quality.

Example 3—Polystyrene

Polystyrene was depolymerized at a temperature between 400° C. and 450° C. in the vacuum oven. A nitrogen gas flow of about 120 SCCM was bubbled through the depolymerized oil. The small chain hydrocarbon molecules were transferred and fed into the catalytic reactor and heated in the presence of stainless steel mesh catalytic materials at a temperature between 700° C. and 800° C., with hydrogen to nitrogen gas flow ratio of about 1:10. A vacuum pressure lesser than 400 Torr (or lesser than 5.33×10$^4$ Pa) was maintained in the reactor.

Figure 13:
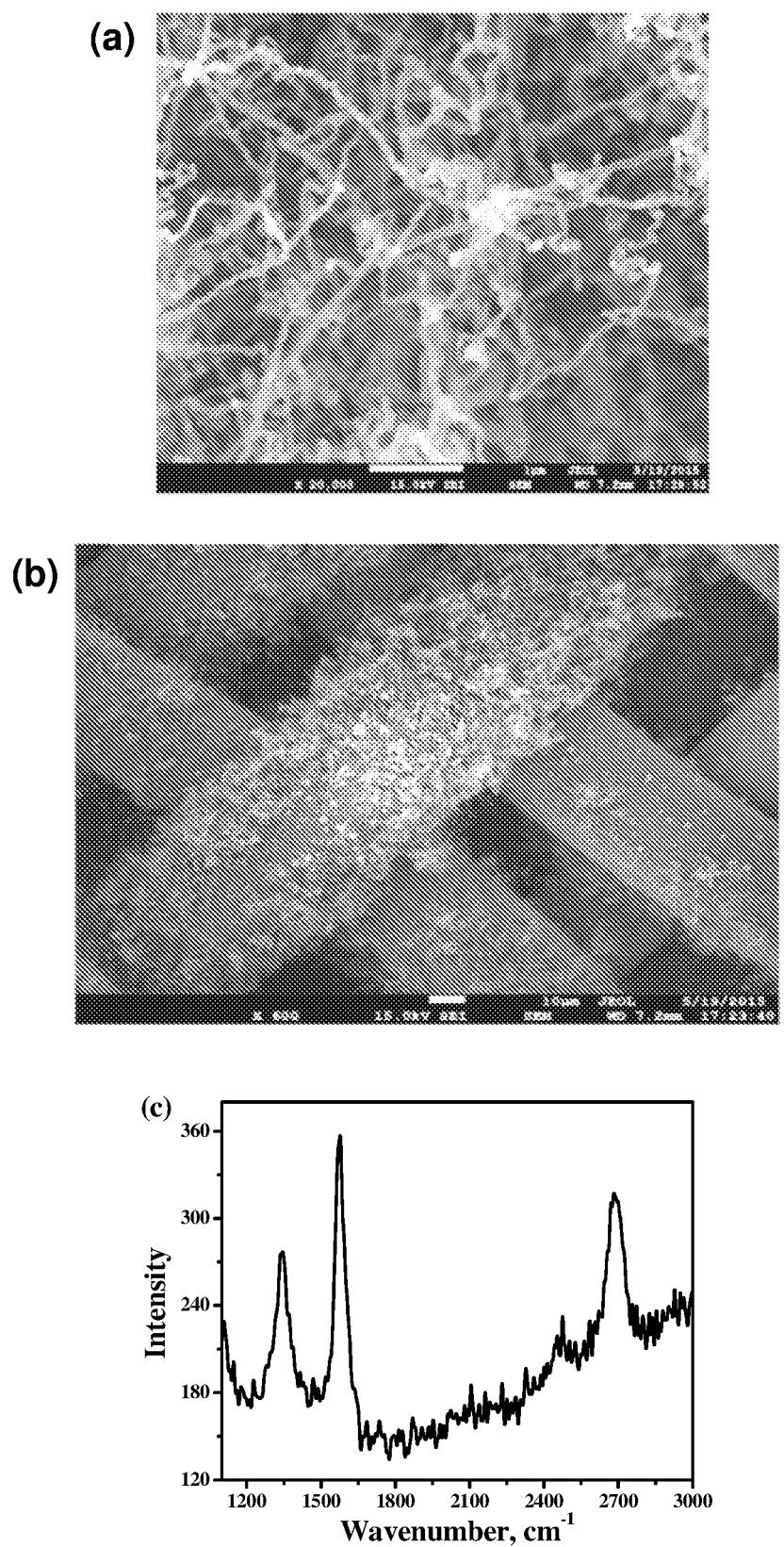
FIG. 13 shows (a) FESEM and (b) TEM images, and (c) Raman analysis of the MWCNTs synthesized from polystyrene.

FIG. 13 shows the morphology and purity analysis of the synthesized CNTs using (a) FESEM; (b) TEM; and (c) Raman analysis. The MWCNTs obtained in this example had diameters in the range of 50 nm to 70 nm, and lengths of 2 μm to 5 μm. This example shows that using different carbon sources and tuning the process conditions, different length and diameter of MWCNTs were obtained.

Example 4—Mixed Polypropylene and Polystyrene

Mixed polypropylene and polystyrene in a weight ratio of 1:2, 1:1 and 2:1 wt %/wt % were considered. A depolymerization temperature of about 420° C. to 480° C. was maintained in the vacuum oven to obtain small chain hydrocarbon molecules. The small chain hydrocarbon molecules were then transferred and fed into the catalytic reactor and heated in the presence of stainless steel mesh catalytic materials at a temperature between 700° C. to 900° C. with a hydrogen to nitrogen gas flow ratio of about 1:6. A vacuum pressure lesser than 400 Torr (or lesser than 5.33×10$^4$ Pa) was maintained in the process. To further improve the quality of the carbon nanotubes, an ethanol additive mixed with water in the ratio of 100:1 was introduced along the 100 SCCM of nitrogen gas hydrocarbon carrier. A significant increase in the length of MWCNTs was observed. This is due to the regeneration of the catalytic materials by the oxidation of small quantities of water in the catalytic CVD process. Moreover, this process led to longer and vertically aligned MWCNTs.

Figure 14:
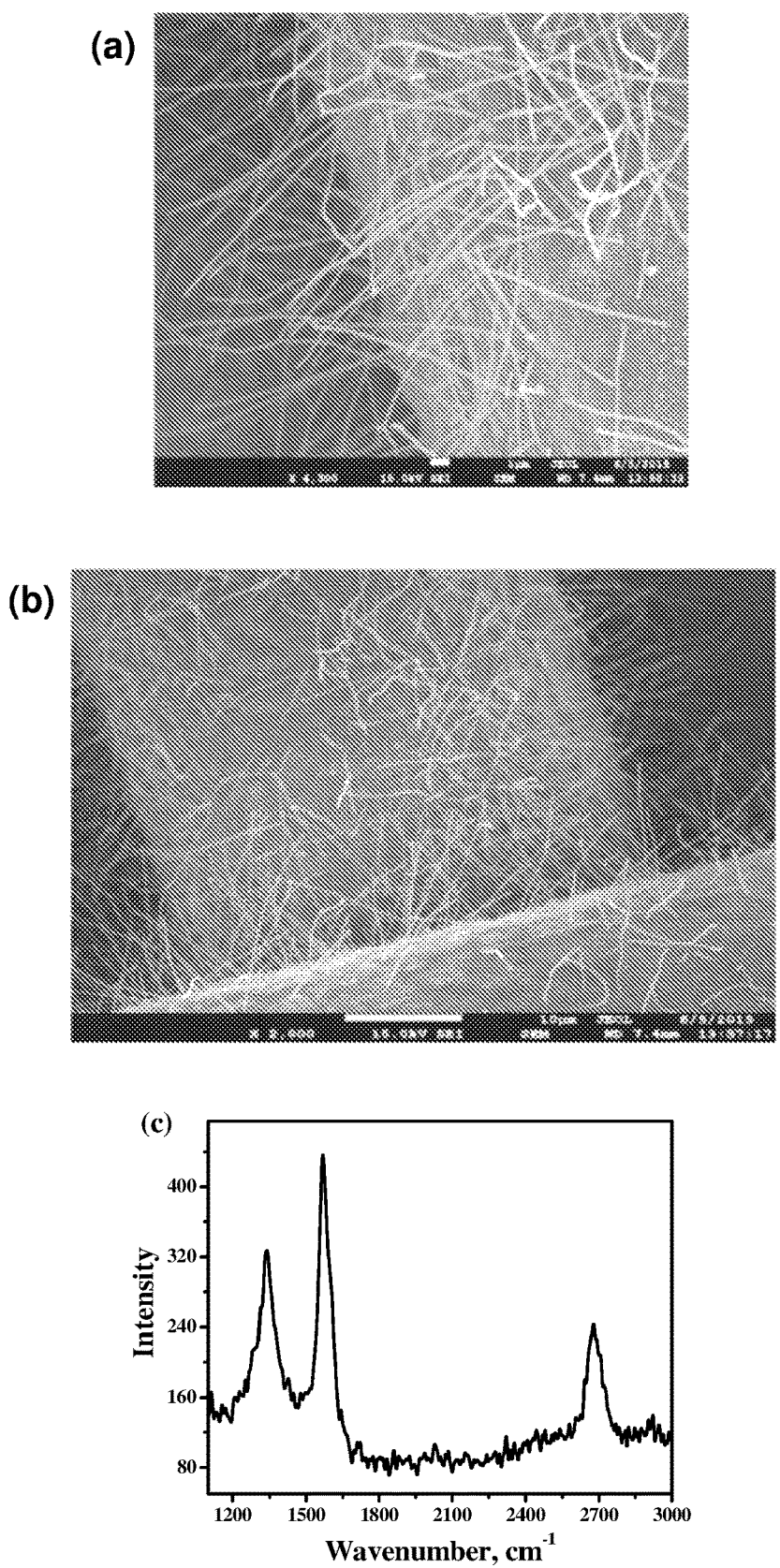
FIG. 14 shows (a) FESEM and (b) TEM images, and (c) Raman analysis of the MWCNTs synthesized from mixed polypropylene (PP) and polystyrene (PS) of 1:1 wt %/wt % with ethanol additive.

FIG. 14 shows the morphology and purity analysis of the carbon nanotubes synthesized from mixed polypropylene and polystyrene of 1:1 wt %/wt % with ethanol additive, using (a) FESEM; (b) TEM; and (c) Raman analysis. The diameters of the MWCNTs were in the range of 100 nm to 130 nm and the lengths were in the range of 20 µm to 30 µm.

Example 5—Rubber Oil

As rubber oil is in liquid form, it was directly fed into a bubbler instead of processing it in a vacuum oven. The rubber oil was first heated to a depolymerisation temperature between 180° C. and 250° C. in the bubbler before passing a nitrogen gas flow of 120 SCCM into the bubbler. The small chain hydrocarbon molecules were transferred and fed into the catalytic reactor and heated in the presence of stainless steel mesh catalytic materials at 600° C. to 700° C., with hydrogen to nitrogen gas flow ratio of about 1:10. A vacuum pressure less than 400 Torr (or lesser than $5.33 \times 10^4$ Pa) was maintained in the catalytic reactor. For hydrocarbon gases, they were uniformly mixed with nitrogen gas stream in the bubbler before passing to the catalytic reactor.

Figure 15:
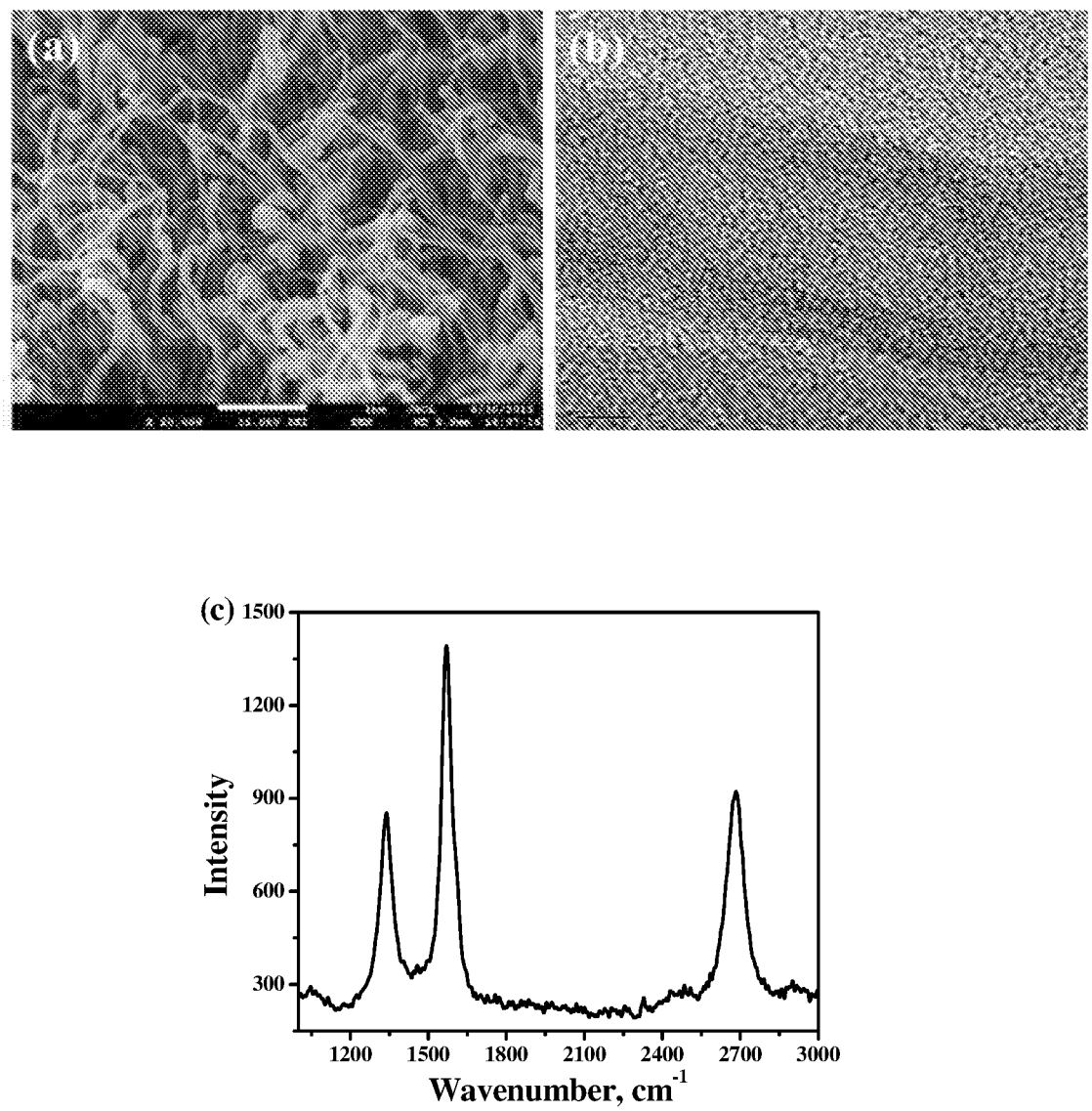
FIG. 15 shows (a) FESEM and (b) TEM images, and (c) Raman analysis of the MWCNTs synthesized from rubber oil.

FIG. 15 shows the morphology and purity analysis of the synthesized carbon nanotubes using FESEM, TEM and Raman analysis. The diameters of the MWCNTs obtained were in the range of 30 nm to 130 nm and the lengths were in the range of 4 µm to 12 µm, with approximately 12 walls.

Example 6—Vegetable Oil

The vegetable oil was processed in a similar manner as the rubber oil. The vegetable oil was first depolymerized at a temperature between 400° C. and 480° C. in a bubbler. A nitrogen gas flow of 120 SCCM was bubbled through the oil. The small chain hydrocarbon molecules were transferred and fed into the catalytic reactor and heated in the presence of stainless steel mesh catalytic materials at 700° C. to 800° C., with hydrogen to nitrogen gas flow ratio of about 1:10. A vacuum pressure less than 400 Torr (or less than $5.33 \times 10^4$ Pa) was maintained in the catalytic reactor.

Figure 16:
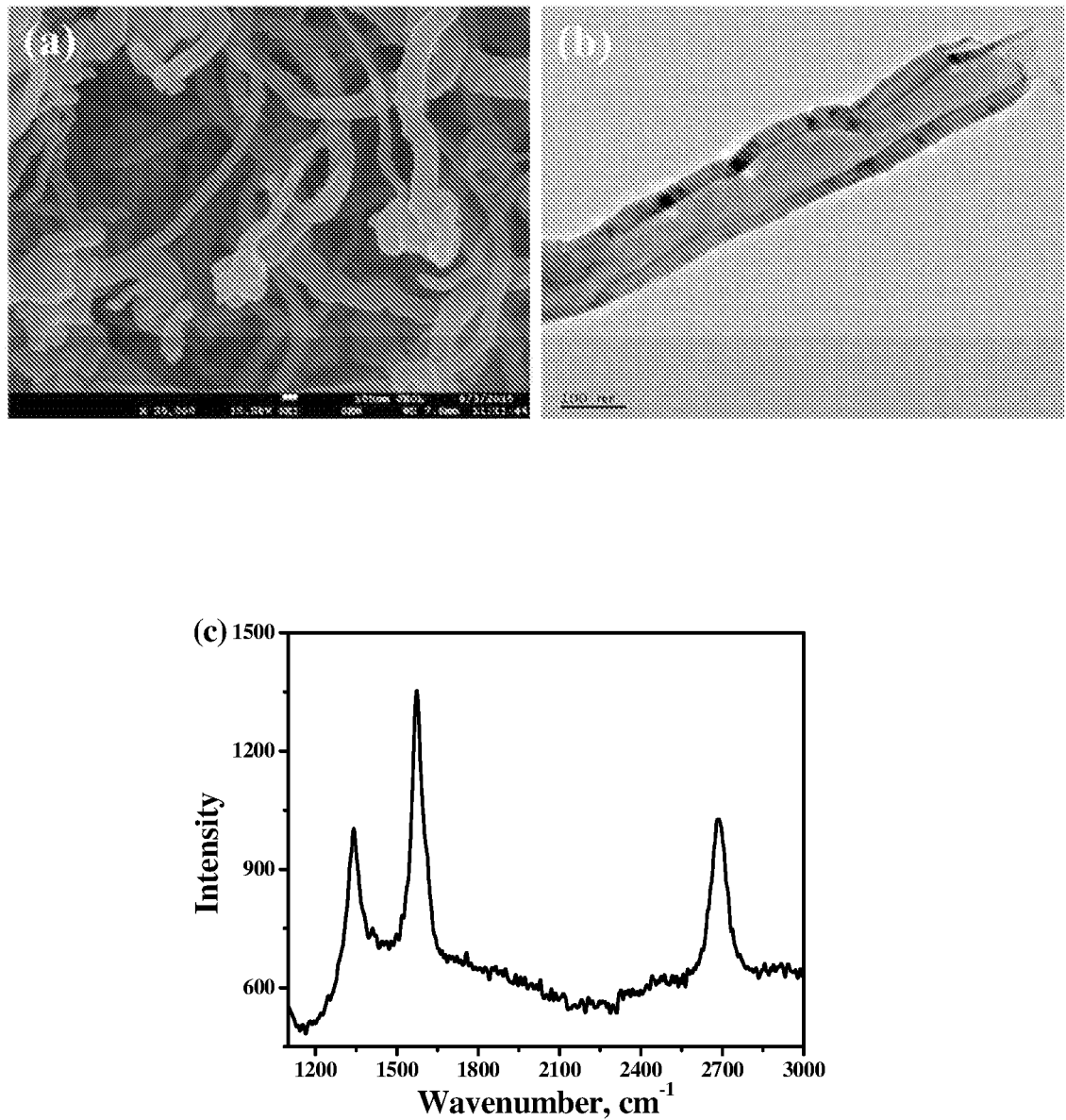
FIG. 16 shows (a) FESEM and (b) TEM images, and (c) Raman analysis of the MWCNTs synthesized from vegetable cooking oil.

FIG. 16 shows the morphology and purity analysis of the synthesized carbon nanotubes using FESEM, TEM and Raman analysis. The diameters of the MWCNTs obtained were in the range of 30 nm to 130 nm and the lengths were in the range of 4 µm to 12 µm.

Example 7—Ethanol

Ethanol was processed in a similar manner as the rubber oil except that the bubbler was maintained at around 90° C. A nitrogen gas flow of 120 SCCM was bubbled through the ethanol. The gaseous ethanol was then transferred and fed into the catalytic reactor and heated in the presence of stainless steel mesh catalytic materials at 700° C. to 800° C., with hydrogen to nitrogen gas flow ratio of about 1:10. A vacuum pressure less than 400 Torr (or less than $5.33 \times 10^4$ Pa) was maintained in the catalytic reactor.

Figure 17:
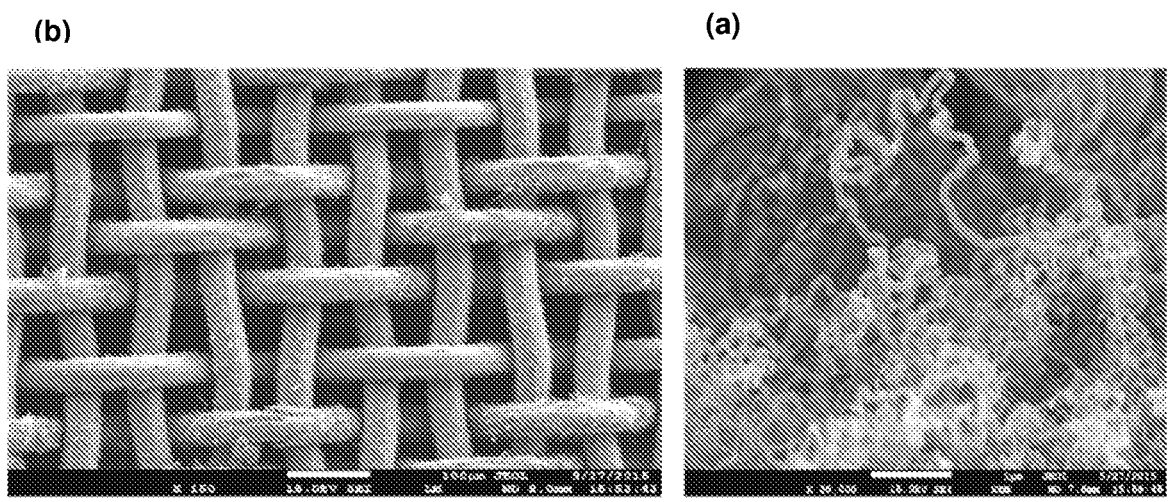
FIG. 17 shows (a) FESEM and (b) TEM images analysis of the MWCNTs synthesized from ethanol.

FIG. 17 shows the morphology and purity analysis of the synthesized carbon nanotubes using FESEM and TEM. The diameters of the MWCNTs obtained were in the range of 20 nm to 70 nm and the lengths were in the range of 2 µm to 5 µm.

The above experimental results show that catalytic CVD process with induction heating and the customized arrangement of the catalytic materials are capable of producing intense eddy currents, thereby generating a temperature between 600° C. and 1,000° C. within 5 minutes. Moreover, the CVD system of the present invention consumes approximately 2 times lesser energy as compared to currently available technologies. In addition, the system and process of the present invention utilize a low cost waste carbon feedstock as source material with a yield of 4%, thus reducing the overall cost of carbon nanotube synthesis. The MWCNTs produced are of high quality and graphitic in nature. Moreover, the catalytic materials employed in the process are able to be reused in the process again by simple oxidation steps, thus reducing the operation cost further.

Table 1 shows a summary of the MWCNTs synthesized from the various low cost non-recyclable carbon wastes using the process and system of the present invention.

TABLE 1

| Carbon Source | Length | Diameter |
| --- | --- | --- |
| Polypropylene (PP) | 2-5 µm | 30-150 nm |
| Polystyrene (PS) | 2-5 µm | 50-70 nm |
| Ethanol | 2-5 µm | 20-70 nm |
| Mixed polypropylene (PP), polystyrene (PS), ethanol and additive (water) | 20-30 µm | 100-130 nm |
| Vegetable cooking oil | 4-12 µm | 30-130 nm |
| Rubber oil | 4-12 µm | 30-130 nm |

The publications mentioned herein are cited for the purpose of describing and disclosing methodologies and concepts that may be used in connection with the present invention. Nothing herein is to be construed as an admission that these references are prior art in relation to the inventions described herein.

The above is a description of the subject matter the inventors regard as the invention and is believed that those skilled in the art can and will design alternative embodiments that include of this invention as set forth in the following claims.

REFERENCES (1) Ajayan, P. M. Nanotubes from Carbon. *Chem Rev* 1999, 99, 1787-1800.
(2) Cumings, J.; Zettl, A. Low-friction nanoscale linear bearing realized from multiwall carbon nanotubes. *Science* 2000, 289, 602-604.
(3) Iijima, S. Helical microtubules of graphitic carbon. *Nature* 1991, 354, 56-58.
(4) Frackowiak, E.; Metenier, K.; Bertagna, V.; Beguin, F. Supercapacitor electrodes from multiwalled carbon nanotubes. *Applied Physics Letters* 2000, 77, 2421-2423.
(5) Dai, H. Carbon Nanotubes: Synthesis, Integration, and Properties. *Accounts of Chemical Research* 2002, 35, 1035-1044.
(6) de Heer, W. A.; Chatelain, A.; Ugarte, D. A Carbon Nanotube Field-Emission Electron Source. *Science* 1995, 270, 1179-1180.
(7) Roschier, L.; Tarkiainen, R.; Ahlskog, M.; Paalanen, M.; Hakonen, P. J. Multiwalled carbon nanotubes as ultrasensitive electrometers. 2001.
(8) Shiflett, M. B.; Foley, H. C. Ultrasonic deposition of high-selectivity nanoporous carbon membranes. *Science* 1999, 285, 1902-1905.
(9) Bazargan, A.; McKay, G. A review—Synthesis of carbon nanotubes from plastic wastes. *Chemical Engineering Journal* 2012, 195-196, 377-391.
(10) Ando, Y.; Iijima, S. Preparation of carbon nanotubes by arc-discharge evaporation. *JAPANESE JOURNAL OF APPLIED PHYSICS PART 2 LETTERS* 1993, 32, L107-L107.

(11) Thess, A.; Lee, R.; Nikolaev, P.; Dai, H. Crystalline ropes of metallic carbon nanotubes. *Science* 1996, 273, 483.

(12) Li, H.; Guan, L.; Shi, Z.; Gu, Z. Direct synthesis of high purity single-walled carbon nanotube fibers by arc discharge. *The Journal of Physical Chemistry B* 2004, 108, 4573-4575.

(13) Dai, H.; Kong, J.; Zhou, C.; Franklin, N.; Tombler, T.; Cassell, A.; Fan, S.; Chapline, M. Controlled Chemical Routes to Nanotube Architectures, Physics, and Devices. *The Journal of Physical Chemistry B* 1999, 103, 11246-11255.

(14) Hou, P.-X.; Liu, C.; Cheng, H.-M. Purification of carbon nanotubes. *Carbon* 2008, 46, 2003-2025.

(15) Andrews, R.; Jacques, D.; Rao, A. M.; Derbyshire, F.; Qian, D.; Fan, X.; Dickey, E. C.; Chen, J. Continuous production of aligned carbon nanotubes: a step closer to commercial realization. *Chemical physics letters* 1999, 303, 467-474.

(16) Lupu, D.; Biriş, A. R.; Jianu, A.; Bunescu, C.; Burkel, E.; Indrea, E.; Mihăilescu, G.; Pruneanu, S.; Olenic, L.; Mişan, I. Carbon nanostructures produced by CCVD with induction heating. *Carbon* 2004, 42, 503-507.

(17) Yuan, D.; Ding, L.; Chu, H.; Feng, Y.; McNicholas, T. P.; Liu, J. Horizontally aligned single-walled carbon nanotube on quartz from a large variety of metal catalysts. *Nano letters* 2008, 8, 2576-2579.

(18) Liu, Y.; Qian, J.; Wang, J. Pyrolysis of polystyrene waste in a fluidized-bed reactor to obtain styrene monomer and gasoline fraction. *Fuel Processing Technology* 2000, 63, 45-55.

(19) Kim, S.-S.; Kim, S. Pyrolysis characteristics of polystyrene and polypropylene in a stirred batch reactor. *Chemical Engineering Journal* 2004, 98, 53-60.

(20) Kruse, T. M.; Levine, S. E.; Wong, H.-W.; Duoss, E.; Lebovitz, A. H.; Torkelson, J. M.; Broadbelt, L. J. Binary mixture pyrolysis of polypropylene and polystyrene: A modeling and experimental study. *Journal of analytical and applied pyrolysis* 2005, 73, 342-354.

(21) Soják, L.; Kubinec, R.; Jurdáková, H.; Hájeková, E.; Bajus, M. High resolution gas chromatographic-mass spectrometric analysis of polyethylene and polypropylene thermal cracking products. *Journal of Analytical and Applied Pyrolysis* 2007, 78, 387-399.

(22) Benallal, B.; Roy, C.; Pakdel, H.; Chabot, S.; Poirier, M. A. Characterization of pyrolytic light naphtha from vacuum pyrolysis of used tyres comparison with petroleum naphtha. *Fuel* 1995, 74, 1589-1594.

(23) Li, Q.; Yan, H.; Zhang, J.; Liu, Z. Effect of hydrocarbons precursors on the formation of carbon nanotubes in chemical vapor deposition. *Carbon* 2004, 42, 829-835.

(24) Baker, R. T. K. Catalytic growth of carbon filaments. *Carbon* 1989, 27, 315-323.

(25) Baker, R. T. K.; Harris, P. S.; Thomas, R. B.; Waite, R. J. Formation of filamentous carbon from iron, cobalt and chromium catalyzed decomposition of acetylene. *Journal of Catalysis* 1973, 30, 86-95.

(26) Dresselhaus, M. S.; Dresselhaus, G.; Saito, R.; Jorio, A. Raman spectroscopy of carbon nanotubes. *Physics Reports* 2005, 409, 47-99.

(27) Rao, A. M.; Jorio, A.; Pimenta, M. A.; Dantas, M. S. S.; Saito, R.; Dresselhaus, G.; Dresselhaus, M. S. Polarized Raman Study of Aligned Multiwalled Carbon Nanotubes. *Physical Review Letters* 2000, 84, 1820-1823.

(28) Yang, Z.; Zhang, Q.; Luo, G.; Huang, J.-Q.; Zhao, M.-Q.; Wei, F. Coupled process of plastics pyrolysis and chemical vapor deposition for controllable synthesis of vertically aligned carbon nanotube arrays. *Applied Physics A* 2010, 100, 533-540.

(29) Alves, J. O.; Zhuo, C.; Levendis, Y. A.; Tenório, J. A. S. Catalytic conversion of wastes from the bioethanol production into carbon nanomaterials. *Applied Catalysis B: Environmental* 2011, 106, 433-444.

(30) Thomsen, C.; Reich, S. Double resonant Raman scattering in graphite. *Physical Review Letters* 2000, 85, 5214.

The invention claimed is:

1. A process for synthesizing multiwall carbon nanotubes comprising:
depolymerizing high molecular polymeric wastes to obtain a carbon-containing feedstock;
pre-treating an array of catalytic materials consisting of 304 type stainless steel with an acid to reduce chromium content in the array of catalytic materials to less than 12%;
introducing a reducing gas into a catalytic reactor containing the array of catalytic materials;
heating the array of catalytic materials in the catalytic reactor by induction heating in the presence of the reducing gas to activate active sites on surfaces of the array of catalytic materials;
feeding the carbon-containing feedstock into the catalytic reactor containing the array of catalytic materials, wherein the array of catalytic materials is arranged in a horizontally stacked manner having a space between any two adjacent catalytic materials sufficient to allow multiwall carbon nanotubes to grow and deposit on surfaces of the catalytic materials;
heating the array of catalytic materials in the presence of the carbon-containing feedstock by induction heating to form multiwall carbon nanotubes on the surfaces of the catalytic materials; and
removing the multiwall carbon nanotubes from the surfaces of the array of catalytic materials.

2. The process according to claim 1, wherein the step of depolymerizing the long chain polymeric carbon sources comprises heating the long chain polymeric carbon sources at a temperature between 400° C. and 480° C. in an inert atmosphere.

3. The process according to claim 2, wherein the long chain polymeric carbon sources are heated for a period between 30 to 120 minutes.

4. The process according to claim 1, further comprising:
feeding the carbon-containing feedstock into a bubbler; and
bubbling an inert gas through the carbon-containing feedstock in the bubbler prior to feeding the carbon-containing feedstock into the reactor.

5. The process according to claim 4, wherein the bubbling of the inert gas into the bubbler is maintained at a flow rate of $0.833 \times 10^{-3}$ to $3 \times 10^{-3}$ m$^3$/s.

6. The process according to claim 1, wherein the carbon-containing feedstock is fed into the catalytic reactor along with an inert carrier gas.

7. The process according to claim 6, wherein the array of catalytic materials is heated in the presence of the reducing gas and in the presence of the carbon-containing feedstock at the same time.

8. The process according to claim 7, wherein the reducing gas comprises hydrogen.

9. The process according to claim 7, further comprising:
mixing the carbon-containing feedstock and the inert carrier gas with the reducing gas prior to feeding the carbon-containing feedstock into the catalytic reactor.

10. The process according to claim 9, wherein the inert carrier gas is nitrogen and the reducing gas is hydrogen, and the nitrogen to hydrogen gas flow ratio is maintained at 1:4 to 1:10.

11. The process according to claim 1, wherein the array of catalytic materials consists of catalytic materials in the form of plates, meshes or sheets consisting of layers of sheets of stainless steel.

12. The process according to claim 11, wherein the array of catalytic materials consists of catalytic materials in the form of metal rods, each of the catalytic materials comprises a plurality of metal rods arranged side-by-side to form a plate and a plurality of said plates are provided to form the array of catalytic materials.

13. The process according to claim 1, wherein the long chain polymeric carbon sources are one or more selected from the group consisting of waste organic solvents, used vegetable oil and cooking oil, and one or more long chain thermoplastic polymers selected from the group consisting of polypropylene, polyethylene, polystyrene, rubbers.

14. The process according to claim 1, wherein the induction heating is carried out using induction coils wound proximate to and around the external wall of the reactor.

15. The process according to claim 14, wherein the induction heating is carried out by applying an AC power output having a frequency in the range of 1 kHz to 60 kHz to the induction coils.

16. The process according to claim 14, wherein the induction heating is carried out at a temperature between 600° C. and 1000° C.

17. The process according to claim 1, wherein the multiwall carbon nanotubes having a length between 2 µm and 30 µm.

18. The process according to claim 1, wherein the multiwall carbon nanotubes having a diameter of 30 nm to 150 nm.

19. The process according to claim 1, wherein the multiwall carbon nanotubes are removed from the catalytic materials by mechanical agitation.

20. The process according to claim 1, wherein the multiwall carbon nanotubes are removed from the catalytic materials ultrasonication of the plurality of catalytic materials in a solvent and subjecting the multiwall carbon nanotubes in the solvent to thermal drying to obtain the multiwall carbon nanotubes.

21. The process according to claim 1, further comprising:
re-activating the plurality of catalytic materials for reuse by thermal activating the plurality of catalytic materials in air at a temperature between 500° C. to 900° C.

22. The process according to claim 21, wherein the thermal activation is carried out in combination with ultrasonication.

23. An apparatus for synthesizing multiwall carbon nanotubes, the apparatus comprising:
a chamber for depolymerizing high molecular polymeric wastes;
a catalytic reactor in fluid communication with the chamber, wherein the catalytic reactor comprises:
a cylindrical outer casing;
an array of catalytic materials consisting of pre-treated 304 type stainless steel having a chromium content of less than 12%;
a holder assembly configured to hold and support the array of catalytic materials, the holder assembly having an inlet, an outlet and a plurality of apertures provided along the longitudinal surface of the holder assembly;
wherein the array of catalytic materials is arranged in a horizontally stacked manner having a space between any two adjacent catalytic materials sufficient to enable multiwall carbon nanotubes to grow on surfaces of the catalytic materials;
a gas distributor channel connected to the holder assembly; and
a heating element wound around the external wall of the outer casing capable of providing uniform induction heating to the array of catalytic materials within the catalytic reactor.

24. The apparatus according to claim 23, wherein the array of catalytic materials consists of catalytic materials in the form of plates, meshes or sheets consisting of layers of sheet of stainless steel.

25. The apparatus according to claim 23, wherein the array of catalytic materials consists of catalytic materials in the form of metal rods, each of the catalytic materials comprises a plurality of metal rods arranged side-by-side to form a plate and a plurality of said plates are provided to form the array of catalytic materials.

26. The apparatus according to 23, wherein the apparatus further comprises:
a first bubbler in fluid communication with the chamber and the catalytic reactor, configured for processing depolymerised feedstock from the chamber and feeding the depolymerized feedstock to the catalytic reactor.

27. The apparatus according to claim 26, wherein the apparatus further comprises:
a second bubbler in fluid communication with the catalytic reactor.

28. A catalytic reactor for synthesizing multiwall carbon nanotubes comprising:
a cylindrical outer casing;
an array of catalytic materials consisting of pre-treated 304 type stainless steel having a chromium content of less than 12%;
a holder assembly configured to hold and support the array of catalytic materials within the cylindrical outer casing, wherein the holder assembly having an inlet, an outlet and a plurality of apertures provided along the longitudinal surface of the holder assembly for distributing gases from within the holder assembly into the catalytic reactor;
a gas distributor channel having a gas inlet and a gas outlet, wherein the gas outlet is connected to the inlet of the holder assembly; and
a heating element wound around the external wall of the outer casing capable of providing uniform induction heating to the array of catalytic materials within the catalytic reactor;
wherein the array of catalytic materials is arranged in a horizontally stacked manner having a space between any two adjacent catalytic materials sufficient to allow multiwall carbon nanotubes to be formed on surfaces of the catalytic materials.

29. The catalytic reactor according to claim 28, wherein the gas distributor channel further comprises a circular disc provided proximate the gas outlet of the gas distributor channel, wherein the circular disc having fastening means for fastening the gas distributor channel to the cylindrical outer casing of the catalytic reactor.

30. A catalytic reactor for synthesizing multiwall carbon nanotubes comprising:
- a cylindrical outer casing;
- an array of catalytic materials consisting of stainless steel;
- a holder assembly configured to hold and support the array of catalytic materials within the cylindrical outer casing, wherein the holder assembly having an inlet, an outlet and a plurality of apertures provided along the longitudinal surface of the holder assembly for distributing gases from within the holder assembly into the catalytic reactor;
- a gas distributor channel having a gas inlet and a gas outlet, wherein the gas outlet is connected to the inlet of the holder assembly; and
- a heating element wound around the external wall of the outer casing capable of providing uniform induction heating to the array of catalytic materials within the catalytic reactor;
- wherein the array of catalytic materials is arranged in a stacked manner having a space between any two adjacent catalytic materials sufficient to allow multiwall carbon nanotubes to be formed on surfaces of the catalytic materials.

31. The catalytic reactor according to claim 28, wherein the array of catalytic materials consists of catalytic materials in the form of metal rods, each of the catalytic materials comprises a plurality of metal rods arranged side-by-side to form a plate and a plurality of said plates are provided to form the array of catalytic materials.

* * * * *